(12) United States Patent
Miyake et al.

(10) Patent No.: US 10,373,980 B2
(45) Date of Patent: Aug. 6, 2019

(54) METHOD OF MANUFACTURING SEMICONDUCTOR DEVICE INCLUDING PIXEL ELECTRODE CONTAINING INDIUM, ZINC, AND METAL ELEMENT

(71) Applicant: Semiconductor Energy Laboratory Co., Ltd., Atsugi-shi, Kanagawa-ken (JP)

(72) Inventors: Hiroyuki Miyake, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/494,833

(22) Filed: Apr. 24, 2017

(65) Prior Publication Data

US 2017/0229488 A1 Aug. 10, 2017

Related U.S. Application Data

(62) Division of application No. 14/269,827, filed on May 5, 2014, now Pat. No. 9,704,894.

(30) Foreign Application Priority Data

May 10, 2013 (JP) .................. 2013-099915

(51) Int. Cl.
*H01L 27/12* (2006.01)
*H01L 27/32* (2006.01)
(Continued)

(52) U.S. Cl.
CPC ........ *H01L 27/1225* (2013.01); *G02F 1/1368* (2013.01); *G02F 1/13439* (2013.01);
(Continued)

(58) Field of Classification Search
CPC combination set(s) only.
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of SOL-Gel-Derived Zinc Oxide Films by Irradiation With Ultraviolet Lamp", Journal of SOL-Gel Science and Technology, 2003, vol. 26, pp. 181-184.
(Continued)

*Primary Examiner* — Lauren Nguyen
(74) *Attorney, Agent, or Firm* — Robinson Intellectual Property Law Office; Eric J. Robinson

(57) ABSTRACT

To provide a display device including a transistor that includes an oxide semiconductor and has favorable characteristics, a pixel electrode electrically connected to the transistor, and a capacitor electrically connected to the pixel electrode. To provide a display device that can be manufactured at low cost. The display device includes a display element including a pixel electrode, a transistor that performs switching of the display element and includes a first oxide semiconductor layer serving as a channel formation region, a capacitor that is electrically connected to the display element and includes a dielectric layer between a pair of electrodes. The pixel electrode is a second oxide semiconductor layer formed on the same surface as that on
(Continued)

which the first oxide semiconductor layer is formed, and also serves as one electrode of the capacitor.

14 Claims, 10 Drawing Sheets

(51) Int. Cl.
    *G02F 1/1333*      (2006.01)
    *G02F 1/1343*      (2006.01)
    *G02F 1/1362*      (2006.01)
    *G02F 1/1368*      (2006.01)
    *H01L 29/786*      (2006.01)

(52) U.S. Cl.
    CPC .. *G02F 1/133345* (2013.01); *G02F 1/136213* (2013.01); *H01L 27/1248* (2013.01); *H01L 27/1255* (2013.01); *H01L 29/7869* (2013.01); *G02F 2201/123* (2013.01); *G02F 2202/10* (2013.01); *H01L 27/3248* (2013.01); *H01L 27/3262* (2013.01); *H01L 27/3265* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,626,669 B2 | 12/2009 | Lim et al. |
| 7,674,650 B2 | 3/2010 | Akimoto et al. |
| 7,732,819 B2 | 6/2010 | Akimoto et al. |
| 7,989,815 B2 | 8/2011 | Yamazaki et al. |
| 8,102,476 B2 | 1/2012 | Son et al. |
| 8,324,027 B2 | 12/2012 | Yamazaki et al. |
| 8,368,066 B2 | 2/2013 | Yamazaki et al. |
| 8,389,988 B2 | 3/2013 | Yamazaki et al. |
| 8,441,007 B2 | 5/2013 | Arai |
| 8,441,011 B2 | 5/2013 | Yamazaki et al. |
| 8,629,434 B2 | 1/2014 | Arai |
| 9,112,043 B2 | 8/2015 | Arai |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0058099 A1 | 3/2007 | Eguchi |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0058099 A1 | 3/2008 | Schwartz et al. |
| 2008/0073653 A1 | 3/2008 | Iwasaki |
| 2008/0083950 A1 | 4/2008 | Pan et al. |
| 2008/0104833 A1 | 5/2008 | Kariya et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0035379 A1 | 2/2010 | Miyairi et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072470 A1 | 3/2010 | Yamazaki et al. |
| 2010/0072472 A1 | 3/2010 | Yamazaki et al. |
| 2010/0092800 A1 | 4/2010 | Itagaki et al. |
| 2010/0109002 A1 | 5/2010 | Itagaki et al. |
| 2010/0163874 A1* | 7/2010 | Koyama ............... H01L 27/12 257/57 |
| 2011/0032435 A1 | 2/2011 | Kimura |
| 2011/0104833 A1* | 5/2011 | Kang ............... H01L 27/1225 438/23 |
| 2011/0140205 A1 | 6/2011 | Sakata et al. |
| 2011/0303953 A1* | 12/2011 | Kamata ............... H01L 27/12 257/253 |
| 2012/0002090 A1 | 1/2012 | Aoki et al. |
| 2012/0062811 A1 | 3/2012 | Miyake |
| 2012/0108018 A1 | 5/2012 | Okabe et al. |
| 2012/0161134 A1* | 6/2012 | Hwang ............... H01L 27/1225 257/59 |
| 2012/0211745 A1 | 8/2012 | Ueda et al. |
| 2012/0241750 A1 | 9/2012 | Chikama et al. |

(56) References Cited

U.S. PATENT DOCUMENTS

| | | |
|---|---|---|
| 2012/0298988 A1 | 11/2012 | Hara et al. |
| 2012/0319107 A1 | 12/2012 | Miyake |
| 2014/0014948 A1 | 1/2014 | Matsukura |
| 2014/0034954 A1 | 2/2014 | Yamazaki et al. |
| 2014/0042432 A1 | 2/2014 | Yamazaki |
| 2014/0042443 A1 | 2/2014 | Yamazaki |
| 2014/0061636 A1 | 3/2014 | Miyake et al. |
| 2014/0061654 A1 | 3/2014 | Yamazaki et al. |
| 2014/0070208 A1 | 3/2014 | Yamazaki |
| 2014/0070209 A1 | 3/2014 | Yamazaki et al. |
| 2014/0070224 A1 | 3/2014 | Yamazaki |
| 2014/0077208 A1 | 3/2014 | Matsukura |
| 2014/0175432 A1 | 6/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2010-170110 A | 8/2010 |
| JP | 2012-104566 A | 5/2012 |
| WO | WO-2004/114391 | 12/2004 |
| WO | WO-2011/010415 | 1/2011 |
| WO | WO-2011/027467 | 3/2011 |

OTHER PUBLICATIONS

Asaoka.Y et al., "29.1: Polarizer-Free Reflective LCD Combined With Ultra Low-Power Driving Technology", SID Digest '09 : SID Internaitonal Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electronc Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al,, "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn]at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA Amoled Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Parks et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application-of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

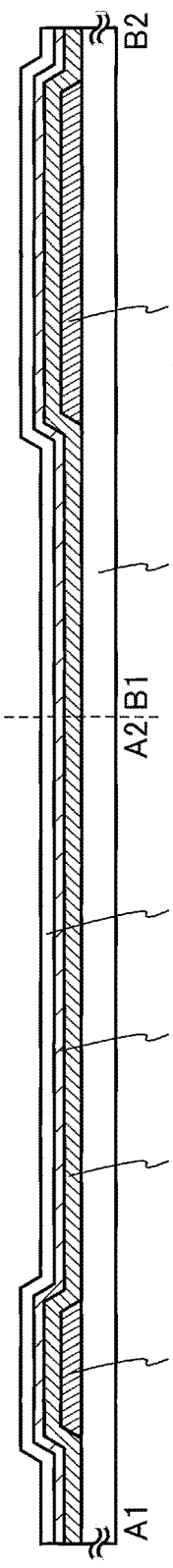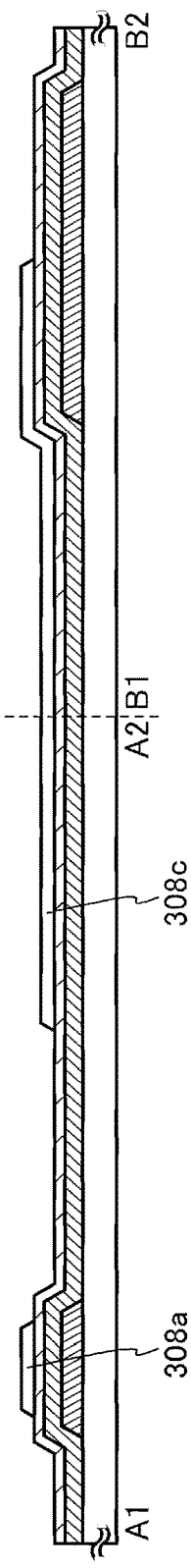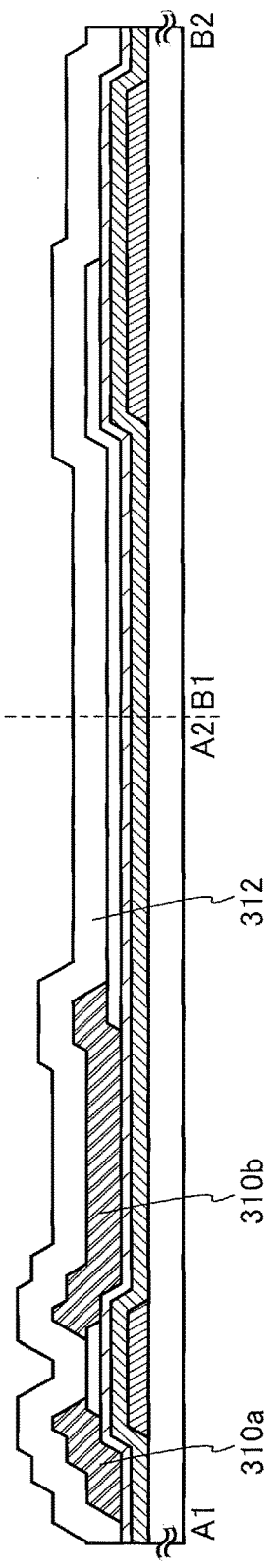

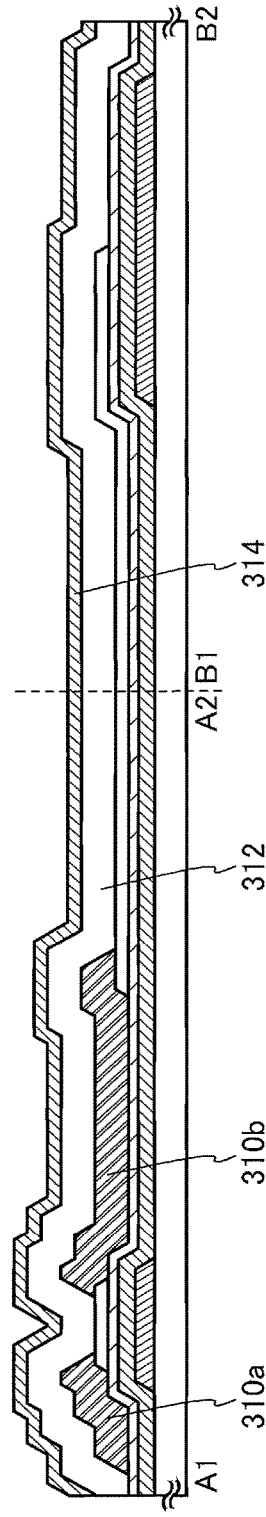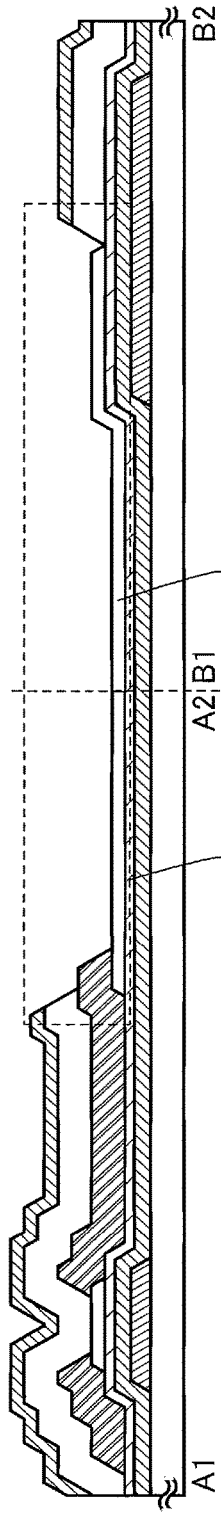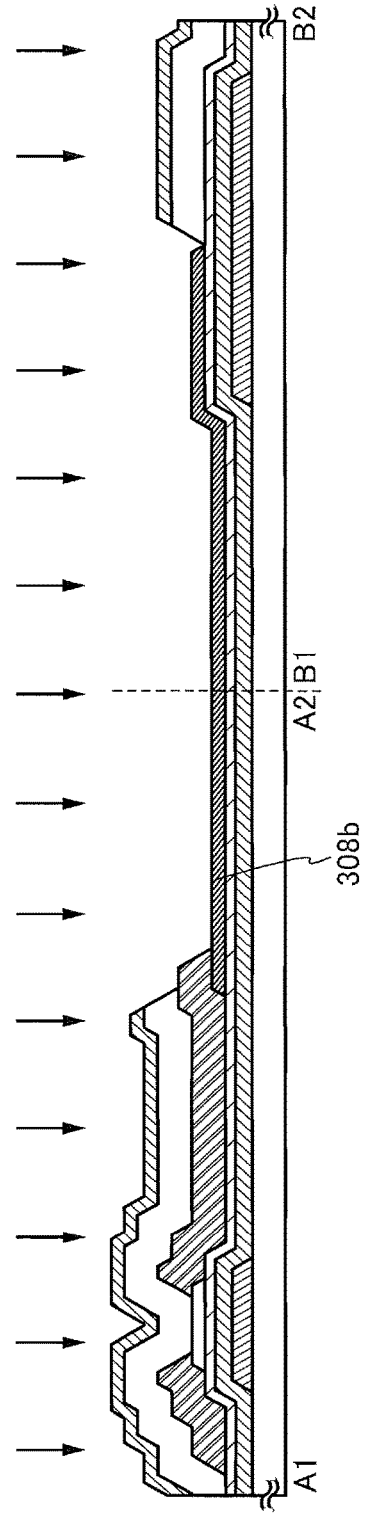

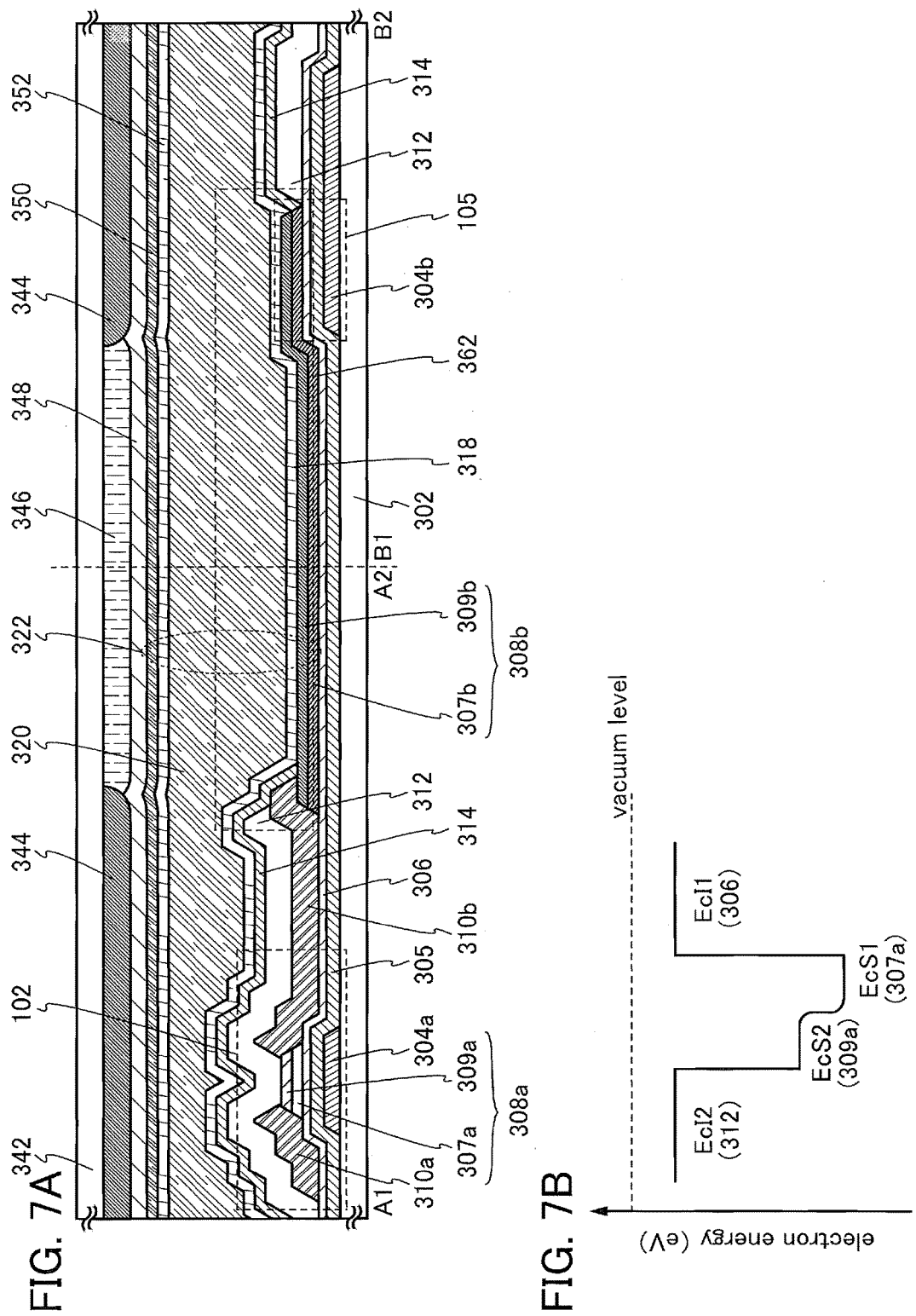

METHOD OF MANUFACTURING SEMICONDUCTOR DEVICE INCLUDING PIXEL ELECTRODE CONTAINING INDIUM, ZINC, AND METAL ELEMENT

BACKGROUND OF THE INVENTION

1. Field of the Invention

The present invention relates to a display device and an electronic device using the display device.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors using such silicon semiconductors are used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor.

For example, such a technique is disclosed in which a transistor is fabricated using zinc oxide or an In—Ga—Zn-based oxide as an oxide semiconductor and the transistor is used as a switching element or the like in a pixel of a display device (see Patent Documents 1 and 2).

A display device that includes a capacitor in which an oxide semiconductor film provided on the same surface as that on which an oxide semiconductor film of a transistor is provided and a pixel electrode electrically connected to the transistor are provided to be a predetermined distance apart from each other in order to increase the aperture ratio is disclosed (see Patent Document 3).

A method for manufacturing a thin film transistor in which including an oxide semiconductor film provided on the same surface as that on which an oxide semiconductor film serving as a pixel electrode is provided is disclosed (see Patent Document 4). In the manufacturing method, an oxide semiconductor film included in a pixel electrode is not patterned alone; an interlayer insulating film covers an oxide semiconductor film that is included in the thin film transistor, and plasma treatment is performed on an exposed portion of the oxide semiconductor film that is not covered by the interlayer insulating film to reduce the resistance of the oxide semiconductor film that is included in the pixel electrode.

REFERENCE

[Patent Document 1] Japanese Published Patent Application No. 2007-123861
[Patent Document 2] Japanese Published Patent Application No. 2007-096055
[Patent Document 3] U.S. Pat. No. 8,102,476
[Patent Document 4] PCT International Publication No. WO2011/010415

SUMMARY OF THE INVENTION

In the display device disclosed in Patent Document 3, a pixel electrode serving as one electrode of a capacitor needs to be formed in a step different from a step of forming an oxide semiconductor layer included in a transistor, which increases the manufacturing cost.

In the method for manufacturing a thin film transistor disclosed in Patent Document 4, there is no technical description of a capacitor, one of components of a display device.

In view of the above problems, an object of one embodiment of the present invention is to provide a novel display device including a transistor that includes an oxide semiconductor and thus has favorable characteristics, a pixel electrode electrically connected to the transistor, and a capacitor electrically connected to the pixel electrode. Another object of one embodiment of the present invention is to provide a display device that can be manufactured at low cost.

Note that the descriptions of these objects do not disturb the existence of other objects. Note that one embodiment of the present invention does not necessarily achieve all the objects. Objects other than the above objects will be apparent from and can be derived from the descriptions of the specification, the drawings, the claims, and the like.

One embodiment of the present invention is a display device that includes a display element including a pixel electrode, a transistor that performs switching of the display element and includes a first oxide semiconductor layer serving as a channel formation region, a capacitor that is electrically connected to the display element and includes a dielectric layer between a pair of electrodes. The pixel electrode is formed using a second oxide semiconductor layer formed on the same surface as that on which the first oxide semiconductor layer is formed, and also serves as one electrode of the capacitor.

Note that the second oxide semiconductor layer serving as the pixel electrode and the one electrode of the capacitor can also be referred to as an oxide semiconductor layer having high conductivity. The oxide semiconductor layer having high conductivity can be formed as follows. When hydrogen is added to an oxide semiconductor including oxygen vacancies, hydrogen enters oxygen vacant sites and forms a donor level in the vicinity of the conduction band. As a result, the conductivity of the oxide semiconductor layer is increased, so that the oxide semiconductor layer becomes conductive. Such an oxide semiconductor layer having become conductive can be referred to as an oxide conductor layer. An oxide semiconductor layer generally has a visible light transmitting property because of its large energy gap. An oxide conductor layer is an oxide semiconductor having a donor level in the vicinity of the conduction band. Therefore, the influence of absorption due to the donor level is small, and an oxide conductor layer has a visible light transmitting property comparable to that of an oxide semiconductor layer.

According to one embodiment of the present invention, the first oxide semiconductor layer serving as the channel formation region of the transistor and the second oxide semiconductor layer serving as the pixel electrode can be formed at the same time. Furthermore, the second oxide semiconductor layer also serves as the one electrode of the capacitor; thus, a step of further forming a conductive layer is unnecessary, reducing the manufacturing steps of the display device. This enables the display device to be manufactured at low cost.

Another embodiment of the present invention is a display device that includes a display element including a pixel electrode, a transistor that performs switching of the display element, a capacitor that is electrically connected to the display element and includes a dielectric layer between a pair of electrodes. The transistor includes a gate electrode, a gate insulating layer over the gate electrode, a first oxide semiconductor layer over the gate insulating layer, and source and drain electrodes over the first oxide semiconductor layer. The pixel electrode is formed using a second oxide semiconductor layer formed on the same surface as that on which the first oxide semiconductor layer is formed, and also serves as one electrode of the capacitor.

In the above structure, the dielectric layer of the capacitor is preferably formed using an insulating layer formed on the same surface as that on which the gate insulating layer is formed. Furthermore, in the above structure, the other electrode of the capacitor is preferably formed using a conductive layer formed on the same surface as that on which the gate electrode is formed.

According to one embodiment of the present invention, the one electrode of the capacitor is formed at the same time as the gate electrode of the transistor. The other electrode of the capacitor is formed at the same time as the oxide semiconductor layer of the transistor. Note that the other electrode of the capacitor also serves as the pixel electrode. In addition, the dielectric layer of the capacitor is formed at the same time as the gate insulating layer of the transistor. Thus, a step of further forming a conductive layer and/or a dielectric layer to form a capacitor and/or a pixel electrode is unnecessary, reducing the manufacturing steps of the display device. This enables the display device to be manufactured at low cost.

According to one embodiment of the present invention, it is possible to provide a novel display device including a transistor that includes an oxide semiconductor and thus has favorable characteristics and, a pixel electrode electrically connected to the transistor, and a capacitor electrically connected to the pixel electrode. Furthermore, the display device can be manufactured at low cost.

BRIEF DESCRIPTION OF THE DRAWINGS

In the accompanying drawings:
FIGS. 3A to 3C are cross-sectional views illustrating one embodiment of a method for manufacturing a display device;
FIGS. 6A to 6C are cross-sectional views illustrating one embodiment of a method for manufacturing a display device;
FIGS. 7A and 7B are a cross-sectional view and a band diagram illustrating one embodiment of a display device.

DETAILED DESCRIPTION OF THE INVENTION

Figure 1:
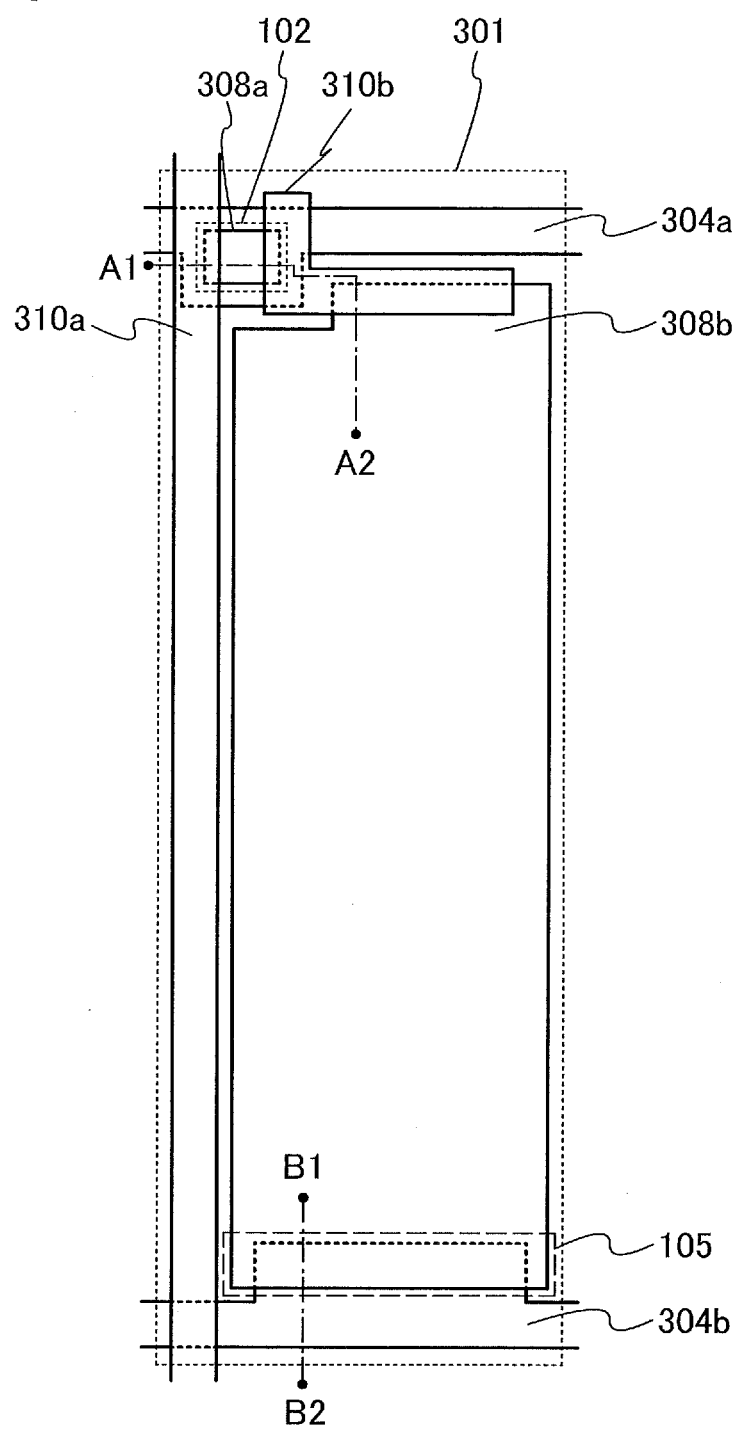
FIG. 1 is a top view illustrating one embodiment of a display device.

Embodiments of the present invention will be described below in detail with reference to the drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. In addition, in the following embodiments, the same portions or portions having similar functions are denoted by the same reference numerals or the same hatch patterns in different drawings, and descriptions thereof are not repeated.

Note that in each drawing described in this specification, the size, the film thickness, or the region of each component may be exaggerated for clarity. Therefore, embodiments of the present invention are not limited to such a scale.

In this specification and the like, ordinal numbers such as "first" and "second" are used in order to avoid confusion among components, and the terms do not limit the components numerically. Therefore, for example, the term "first" can be replaced with the term "second", "third", or the like as appropriate.

Note that functions of a "source" and a "drain" of a transistor are sometimes replaced with each other when a transistor of opposite polarity is used or when the direction of current flow is changed in circuit operation, for example. Therefore, the terms "source" and "drain" can be used to denote the drain and the source, respectively, in this specification.

Embodiment 1

In this embodiment, a display device of one embodiment and a manufacturing method of the display device of one embodiment of the present invention will be described with reference to FIG. 1, FIG. 2, FIGS. 3A to 3C, FIGS. 4A to 4C, FIG. 5, FIGS. 6A to 6C, FIGS. 7A and 7B, and FIG. 8.

<Structural Example of Display Device>

Figure 2:
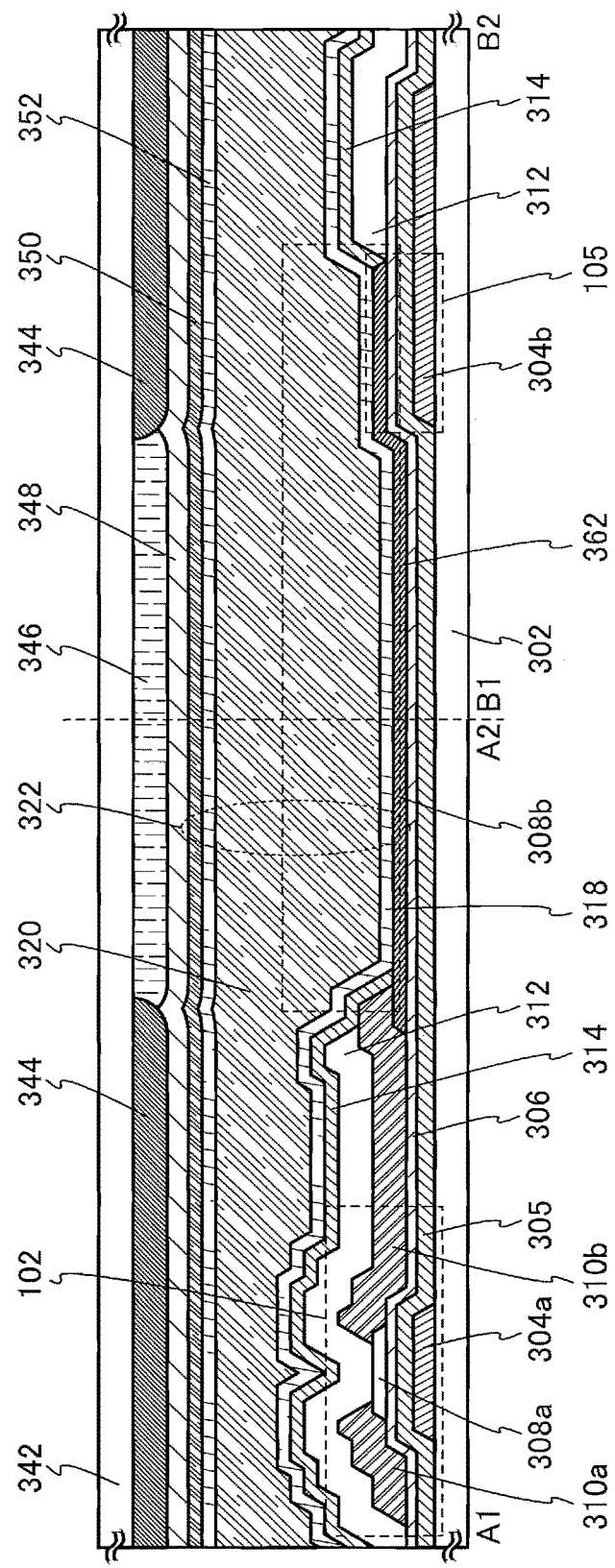
FIG. 2 is a cross-sectional view illustrating one embodiment of a display device.

FIGS. 1 and 2 illustrate a structural example of the display device. FIG. 1 is a plan view of a pixel 301 included in a display device, and FIG. 2 is a cross-sectional view along dashed-dotted lines A1-A2 and B1-B2 in FIG. 1. Note that in FIG. 1, some components (e.g., insulating layers 305 and 306) of the pixel 301, a display element provided over the pixel 301, and the like are not illustrated for simplicity.

In the pixel 301 in FIG. 1, a conductive layer 304a serving as a scan line extends substantially perpendicularly to a signal line (in the horizontal direction in the drawing). The conductive layer 310a serving as the signal line extends substantially perpendicularly to the scan line (in the vertical direction in the drawing). A conductive layer 304b serving as a capacitor line extends in parallel to the signal line.

Furthermore, the pixel 301 in FIG. 1 includes the transistor 102. The transistor 102 is provided at a region where the scan line and the signal line intersect each other. The transistor 102 includes a conductive layer 304a serving as a gate electrode, a gate insulating layer (not illustrated in FIG. 1), an oxide semiconductor layer 308a that is over the gate insulating layer and in which a channel region is formed, and conductive layers 310a and 310b serving as source and drain electrodes.

The conductive layer 304a serves as a scan line and a gate electrode; the conductive layer 304a that overlaps with the oxide semiconductor layer 308a serves as the gate electrode of the transistor 102. The conductive layer 310a serves as a signal line and a source electrode; the conductive layer 310a that overlaps with the oxide semiconductor layer 308a serves as the source electrode of the transistor 102. In the top view of FIG. 1, an edge of the scan line is on the outer side than an edge of the oxide semiconductor layer 308a. Thus, the scan line also serves as a light-blocking layer for blocking light from a light source such as a backlight. For this reason, the oxide semiconductor layer 308a included in the transistor 102 is not irradiated with light, so that a change in the electrical characteristics of the transistor 102 can be suppressed.

Part of the conductive layer 310b that serves as the drain electrode is over the oxide semiconductor layer 308b formed at the same time as the oxide semiconductor layer 308a. Part of the oxide semiconductor layer 308b overlaps with the conductive layer 304b that serves as a capacitor line and is formed at the same time as the conductive layer 304a.

The oxide semiconductor layer 308b serves as a pixel electrode in the pixel 301.

The pixel 301 illustrated in FIG. 1 includes a capacitor 105. The capacitor 105 includes a dielectric layer between a pair of electrodes. One of the pair of electrodes is formed using the conductive layer 304b serving as the capacitor line, and the other electrode is formed using the oxide semiconductor layer 308b. As the dielectric layer of the capacitor 105, an insulating layer formed in the same step as the gate insulating layer of the transistor 102. In other words, the dielectric layer of the capacitor 105 is an insulating layer formed on the same surface as that on which the gate insulating layer of the transistor 102 is formed.

Thus, the oxide semiconductor layer 308b is formed on the same surface as that on which the oxide semiconductor layer 308a serving as a channel formation region of the transistor 102, and serves as the pixel electrode and the one electrode of the capacitor 105.

Thus, a step of further forming a conductive layer is not needed to form the capacitor and the pixel electrode, whereby the manufacturing steps of the display device can be reduced.

Next, FIG. 2 is a cross-sectional view along dashed-dotted lines A1-A2 and B1-B2 in FIG. 1.

The display device of one embodiment of the present invention illustrated in FIG. 2 includes a liquid crystal element 322 between a pair of substrates (a substrate 302 and a substrate 342).

The liquid crystal element 322 includes the oxide semiconductor layer 308b, layers each having an alignment property (hereinafter referred to as alignment films 318 and 352), a liquid crystal layer 320, and a conductive layer 350. The oxide semiconductor layer 308b serves as one electrode of the liquid crystal element 322, and the conductive layer 350 serves as the other electrode of the liquid crystal element 322. Although a structure where the liquid crystal element 322 includes the alignment films 318 and 352 is described in this embodiment, the liquid crystal element 322 is not limited thereto. For example, a structure where the liquid crystal element 322 does not include the alignment films 318 and 352 may be employed.

Note that in this embodiment, a liquid crystal display device will be described in which a vertical electric field mode is used as a driving method of the liquid crystal element 322.

A "liquid crystal display device" refers to a display device including a liquid crystal element. The liquid crystal display device includes a driver circuit for driving a plurality of pixels, for example. The liquid crystal display device also includes a control circuit, a power supply circuit, a signal generation circuit, a back light module, and the like provided on another substrate, and can be referred to as a liquid crystal module.

The transistor 102 included in the display device in FIG. 2 includes the conductive layer 304a that serves as the gate electrode, the insulating layers 305 and 306 that are over the conductive layer 304a and serve as gate insulating layers, the oxide semiconductor layer 308a over the gate insulating layers, and the conductive layers 310a and 310b that are over the oxide semiconductor layer 308a and serve as the source and drain electrodes. The insulating layers 312 and 314 are provided as protective films over the transistor 102, more in details, over the oxide semiconductor layer 308a and the conductive layers 310a and 310b.

The conductive layer 310b serving as the drain electrode of the transistor 102 is over and in contact with part of a top surface of the oxide semiconductor layer 308b. The oxide semiconductor layer 308b is formed in the same step as the oxide semiconductor layer 308a so as to be over the insulating layer 306 serving as the gate insulating layer. Note that the oxide semiconductor layer serves as the pixel electrode in the pixel 301.

The capacitor 105 included in the display device in FIG. 2 has a dielectric layer between the pair of electrodes. One of the pair of electrodes is formed using the conductive layer 304b, and the other electrode is formed using the oxide semiconductor layer 308b. The dielectric layer of the capacitor 105 is formed using the insulating layers 305 and 306 serving as the gate insulating layers of the transistor 102. In other words, the insulating layers 305 and 306 are provided for both the transistor 102 and the capacitor 105. Portions of the insulating layers 305 and 306 that overlap with the conductive layer 304a serve as the gate insulating layers of the transistor 102, and portions of the insulating layers 305 and 306 that overlap with the conductive layer 304b serves as the dielectric layer of the capacitor 105. Although FIG. 2 illustrates a layered structure of the insulating layers 305 and 306, this layered structure is not necessarily employed and a single-layer structure or a layered structure including three or more layers may be employed.

The oxide semiconductor layer 308a and the oxide semiconductor layer 308b are layers processed into island-like shapes through the same film formation step and the same etching step. An oxide semiconductor is a semiconductor material whose resistivity can be controlled by oxygen vacancies in the film of the semiconductor material and/or the concentration of impurities such as hydrogen or water in the film of the semiconductor material. Thus, treatment to be performed on the oxide semiconductor layers 308a and 308b is selected from the following to control the resistivity of each of the oxide semiconductor layers 308a and 308b formed through the same steps: treatment for increasing oxygen vacancies and/or impurity concentration and treatment for reducing oxygen vacancies and/or impurity concentration.

Specifically, plasma treatment is performed on the oxide semiconductor layer 308b serving as the pixel electrode and the electrode of the capacitor to increase oxygen vacancies and/or impurities such as hydrogen or water in the oxide semiconductor layer 308b, so that the carrier density can be increased and the resistivity can be reduced. Furthermore, an insulating layer containing hydrogen is formed in contact with the oxide semiconductor layer 308b to diffuse hydrogen from the insulating layer containing hydrogen to the oxide semiconductor layer 308b, so that the oxide semiconductor layer 308b can have a higher carrier density and a lower resistance.

On the other hand, the insulating layer 312 is provided to prevent the oxide semiconductor layer 308a included in the transistor 102 from being subjected to the plasma treatment. Since the insulating layer 312 is provided, the oxide semiconductor layer 308a is not in contact with the insulating layer 314 containing hydrogen. The insulating layer 312 can be formed as an insulating layer capable of releasing oxygen, in which case oxygen can be supplied to the oxide semiconductor layer 308a. The oxide semiconductor layer 308a to which oxygen is supplied is an oxide semiconductor in which oxygen vacancies in the film or at the interface are filled with and which has higher resistance. Note that as the insulating layer capable of releasing oxygen, a silicon oxide film or a silicon oxynitride film can be used, for example.

As the plasma treatment to be performed on the oxide semiconductor layer 308b, plasma treatment using a gas containing one of a rare gas (He, Ne, Ar, Kr, or Xe), hydrogen, and nitrogen is typical. Specifically, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, plasma treatment in a nitrogen atmosphere, or the like can be employed.

By the plasma treatment, an oxygen vacancy is formed in a lattice from which oxygen is released (or in a portion from which oxygen is released) in the oxide semiconductor layer 308b. The oxygen vacancy might cause carrier generation. Further, when hydrogen is supplied from an insulating film that is in the vicinity of the oxide semiconductor layer 308b, specifically, that is in contact with the lower surface or the upper surface of the oxide semiconductor layer 308b, and hydrogen is combined with the oxygen vacancy, an electron serving as a carrier might be generated. Accordingly, the oxide semiconductor layer 308b whose oxygen vacancies are increased by the plasma treatment has higher carrier density than the oxide semiconductor layer 308a.

The oxide semiconductor layer 308a in which oxygen vacancies are filled with oxygen and the hydrogen concentration is reduced can be referred to as a highly purified intrinsic or substantially highly purified intrinsic oxide semiconductor layer. The term "substantially intrinsic" refers to the state where an oxide semiconductor has a carrier density lower than $1\times10^{17}/cm^3$, preferably lower than $1\times10^{15}/cm^3$, more preferably lower than $1\times10^{13}/cm^3$. A highly purified intrinsic or substantially highly purified intrinsic oxide semiconductor has few carrier generation sources, and thus can have a low carrier density. The highly purified intrinsic or substantially highly purified intrinsic oxide semiconductor layer 308a has a low density of defect states and accordingly can have a low density of trap states.

Furthermore, the highly purified intrinsic or substantially highly purified intrinsic oxide semiconductor layer 308a has an extremely low off-state current; even when an element has a channel width of $1\times10^6$ μm and a channel length L of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode in the range from 1 V to 10 V. Thus, the transistor 102 whose channel region is formed in the oxide semiconductor layer 308a has a small change in electrical characteristics and is highly reliable.

The insulating layer 312 in FIG. 2 is formed in such a manner that the insulating layer that overlaps with the oxide semiconductor layer 308b serving as the pixel electrode and the electrode of the capacitor is selectively removed. The insulating layer 314 may be formed in such a manner that the insulating layer is formed in contact with the oxide semiconductor layer 308b and then partly removed. For example, an insulating layer containing hydrogen, that is, an insulating layer that can release hydrogen, typically, a silicon nitride film containing hydrogen, is used as the insulating layer 314, whereby hydrogen can be supplied to the oxide semiconductor layer 308b. The insulating layer that can release hydrogen preferably has a hydrogen concentration of $1\times10^{22}$ atoms/cm$^3$ or higher. Such an insulating layer is formed in contact with the oxide semiconductor layer 308b, whereby hydrogen can be effectively contained in the oxide semiconductor layer 308b. In this manner, the above-described plasma treatment is performed and the structure of the insulating layer in contact with the oxide semiconductor layer is changed, whereby the resistivity of the oxide semiconductor layer can be appropriately adjusted.

Hydrogen contained in the oxide semiconductor layer 308b reacts with oxygen bonded to a metal atom to be water, and in addition, an oxygen vacancy is formed in a lattice from which oxygen is released (or a portion from which oxygen is released). Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, the oxide semiconductor layer 308b containing hydrogen has a higher carrier density than the oxide semiconductor layer 308a.

Hydrogen in the oxide semiconductor layer 308a of the transistor 102 in which a channel is formed is preferably reduced as much as possible. Specifically, in the oxide semiconductor 308a, the hydrogen concentration measured by secondary ion mass spectrometry (SIMS) is set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, more preferably lower than or equal to $5\times10^{18}$ atoms/cm$^3$, more preferably lower than or equal to $1\times10^{18}$ atoms/cm$^3$, more preferably lower than or equal to $5\times10^{17}$ atoms/cm$^3$, more preferably lower than or equal to $1\times10^{16}$ atoms/cm$^3$.

On the other hand, the oxide semiconductor layer 308a serving as the pixel electrode and the electrode of the capacitor is a low-resistance oxide semiconductor layer that has high hydrogen concentration and/or a large amount of oxygen vacancies as compared to the oxide semiconductor layer 308b Note that other components of the display device illustrated in FIGS. 1 and 2 will be described in detail in Method for manufacturing display device.

<Method for Manufacturing Display Device>

Examples of a method for manufacturing the display device illustrated in FIGS. 1 and 2 will be described with reference to FIGS. 3A to 3C, FIGS. 4A to 4C, FIG. 5, and FIGS. 6A to 6C.

First, the conductive layers 304a and 304b are formed over the substrate 302, and the insulating layers 305 and 306 are formed over the conductive layers 304a and 304b. After that, an oxide semiconductor layer 307 is formed over the insulating layer 306 (see FIG. 3A).

There is no particular limitation on a material and the like of the substrate 302 as long as the material has heat resistance high enough to withstand at least heat treatment performed later. For example, a glass substrate, a ceramic substrate, a quartz substrate, or a sapphire substrate may be used as the substrate 302. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 302. Still alternatively, any of these substrates provided with a semiconductor element may be used as the substrate 302. In the case where a glass substrate is used as the substrate 302, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm); thus, a large-sized display device can be manufactured. Still alternatively, a flexible substrate may be used as the substrate 302, a display element, the transistor 102, and the like may be directly provided on the flexible substrate.

The conductive layers 304a and 304b can be formed using a metal material such as molybdenum, titanium, tantalum, tungsten, aluminum, copper, chromium, neodymium, scandium, or the like, or an alloy material that contains any of these materials as its main component. Alternatively, a semiconductor film typified by a polycrystalline silicon film doped with an impurity element such as phosphorus, or a silicide film such as a nickel silicide film may be used for the conductive layers 304a and 304b. The conductive layers 304a and 304b can each have either a single-layer structure or a layered structure. The conductive layers 304a and 304b may each have a tapered shape with a taper angle of greater than or equal to 15° and less than or equal to 70°, for example. Here, the taper angle refers to an angle formed between a side surface of a layer having a tapered shape and a bottom surface of the layer.

The insulating layers 305 and 306 correspond to the gate insulating layer of the transistor 102 and the dielectric layer of the capacitor 105. As each of the insulating layers 305 and 306, an insulating layer including at least one of the following films formed by a plasma CVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the layered structure of the insulating layers 305 and 306 is not necessarily employed, and an insulating layer with a single-layer structure including any of the above films may be used.

Note that the insulating layer 306 in contact with the oxide semiconductor layer 307 is preferably an oxide insulating layer and preferably has a region (oxygen-excess region) containing oxygen in excess of that in the stoichiometric composition. To provide the oxygen-excess region in the insulating layer 306, the insulating layer 306 can be formed in an oxygen atmosphere, for example. Alternatively, oxygen may be introduced into the formed insulating layer 306 to form the oxygen-excess region therein. As a method for introducing oxygen, an ion implantation method, an ion doping method, a plasma immersion ion implantation method, plasma treatment, or the like may be employed.

In this embodiment, a silicon nitride layer is formed as the insulating layer 305, and a silicon oxide layer is formed as the insulating layer 306. The silicon nitride layer has a higher dielectric constant than the silicon oxide layer and needs to have a larger film thickness than the silicon oxide layer to obtain capacitance equivalent to that of the silicon oxide layer. Thus, when the silicon nitride layer is included in the insulating layer 305 serving as the gate insulating layer of the transistor 102 and the dielectric layer of the capacitor 105, the physical thickness of the insulating layer can be increased. This makes it possible to reduce a decrease in withstand voltage of the transistor 102 and the capacitor 105 and furthermore to increase the withstand voltage, thereby reducing electrostatic discharge damage to the transistor 102 and the capacitor 105.

The oxide semiconductor layer 307 preferably includes a film represented by an In-M-Zn oxide that contains at least indium (In), zinc (Zn), and M (M is a metal such as Al, Ti, Ga, Y, Zr, La, Ce, Nd or Hf). Alternatively, both In and Zn are preferably contained. To reduce variations in electrical characteristics of the transistors including the oxide semiconductor, the oxide semiconductor preferably contains a stabilizer in addition to In and Zn.

Examples of the stabilizer include gallium (Ga), tin (Sn), hafnium (Hf), aluminum (Al), and zirconium (Zr). Other examples of the stabilizer include lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor included in the oxide semiconductor layer 307, for example, any of the following can be used: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that an In—Ga—Zn-based oxide means an oxide containing In, Ga, and Zn as its main components and there is no particular limitation on the ratio of In, Ga, and Zn. The In—Ga—Zn-based oxide may contain a metal element other than the In, Ga, and Zn.

As a method for forming the oxide semiconductor layer 307, a sputtering method, a molecular beam epitaxy (MBE) method, a CVD method, a pulse laser deposition method, an atomic layer deposition (ALD) method, or the like can be used as appropriate.

In forming the oxide semiconductor layer 307, the concentration of hydrogen to be contained is preferably as low as possible. For example, in the case of a sputtering method, a deposition chamber needs to be highly evacuated and also a sputtering gas needs to be highly purified, in order to reduce the hydrogen concentration. As an oxygen gas or an argon gas used as the sputtering gas, a gas that is highly purified to have a dew point of −40° C. or lower, preferably −80° C. or lower, more preferably −100° C. or lower, still more preferably −120° C. or lower is used, so that entry of moisture or the like into the oxide semiconductor layer 307 can be prevented as much as possible.

In order to remove moisture remaining in the deposition chamber, an entrapment vacuum pump, such as a cryopump, an ion pump, or a titanium sublimation pump, is preferably used. Alternatively, a turbo molecular pump provided with a cold trap may be used. A cryopump has a high capability in removing a hydrogen molecule, a compound containing a hydrogen atom, such as water ($H_2O$) (preferably, also a compound containing a carbon atom), and the like; thus, the impurity concentration in the film formed in the deposition chamber evacuated with the cryopump can be reduced.

In the case where the oxide semiconductor layer 307 is formed by a sputtering method, the relative density (fill rate) of a metal oxide target that is used for the deposition is greater than or equal to 90% and less than or equal to 100%, preferably greater than or equal to 95% and less than or equal to 100%. With the use of the metal oxide target having high relative density, a dense film can be formed.

Note that formation of the oxide semiconductor layer 307 while the substrate 302 is maintained at a high temperature is also effective in reducing the impurity concentration in the oxide semiconductor layer 307. The heating temperature of the substrate 302 is higher than or equal to 150° C. and lower than or equal to 450° C., and preferably, the substrate temperature is higher than or equal to 200° C. and lower than or equal to 350° C.

Next, the oxide semiconductor layer 307 is processed into a desired shape, so that the island-shaped oxide semiconductor layers 308a and 308c are formed (see FIG. 3B).

The oxide semiconductor layer 308c, which becomes the oxide semiconductor layer 308b later, and the oxide semiconductor layer 308a are formed by processing the oxide semiconductor layer 307; therefore, they contain at least the same metal elements. When the oxide semiconductor layer 307 is processed by etching, part of the insulating layer 306 (a region not covered with the oxide semiconductor layer 308a and the oxide semiconductor layer 308c) might be etched to be thinned because of overetching of the oxide semiconductor layer 307.

After the island-shaped oxide semiconductor layer 308a and 308c are formed, heat treatment is performed. The heat treatment is preferably performed at a temperature of higher than or equal to 250° C. and lower than or equal to 650° C., preferably higher than or equal to 300° C. and lower than or equal to 400° C., more preferably higher than or equal to 320° C. and lower than or equal to 370° C., in an inert gas atmosphere, an atmosphere containing an oxidizing gas at 10 ppm or more, or a reduced pressure atmosphere. Alternatively, the heat treatment may be performed in such a manner that heat treatment is performed in an inert gas atmosphere, and then another heat treatment is performed in an atmosphere containing an oxidizing gas at 10 ppm or more in order to compensate released oxygen. By the heat treatment, an impurity such as hydrogen or water can be removed from at least one of the insulating layers 305 and 306 and the oxide semiconductor layers 308a and 308c. Note that the heat treatment may be performed before the oxide semiconductor film 307 is processed into an island shape.

In order to obtain stable electrical characteristics of the transistor 102 including an oxide semiconductor serving as a channel formation region, it is effective to reduce the impurity concentration in the oxide semiconductor so that the oxide semiconductor becomes intrinsic or substantially intrinsic.

Next, the conductive layers 310a and 310b and the insulating layer 312 are formed over the insulating layer 306 and the oxide semiconductor layers 308a and 308c (see FIG. 3C).

The conductive layers 310a and 310b can each be formed to have a single-layer structure or a layered structure using any of single metals such as aluminum, titanium, chromium, nickel, copper, yttrium, zirconium, molybdenum, silver, tantalum, and tungsten, or an alloy containing any of these single metals as its main component. For example, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. The conductive layers 310a and 310b can be formed by a sputtering method, for example.

For the insulating film layer 312, a silicon oxide film, a silicon oxynitride film, an aluminum oxide film, or the like having a thickness in the range from 150 nm to 400 nm can be used, for example. In this embodiment, a 300-nm-thick silicon oxynitride film is used as the insulating layer 312. The insulating layer 312 can be formed by a PE-CVD method, for example.

Figure 4A:
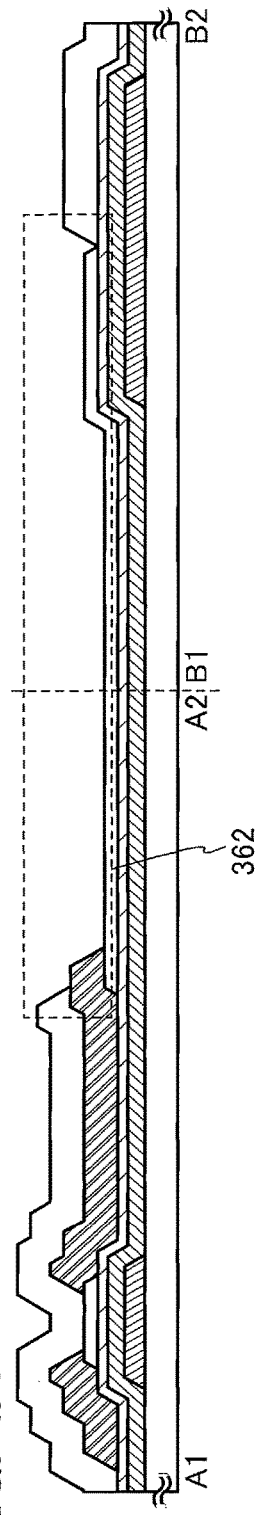
FIGS. 4A to 4C are cross-sectional views illustrating one embodiment of a method for manufacturing a display device.
Figure 4B:
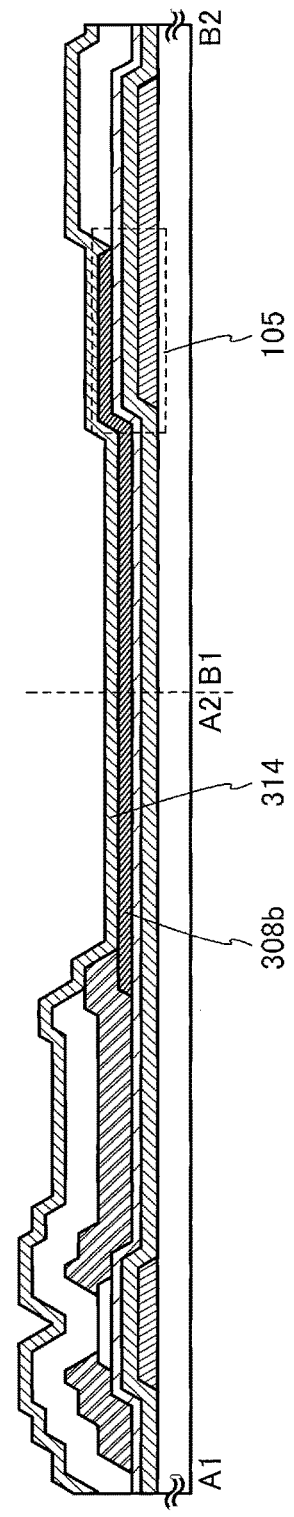

Then, the insulating layer 312 is processed into a desired shape so that an opening 362 is formed (see FIG. 4A).

The opening 362 is formed so as to expose the oxide semiconductor layer 308c. An example of a formation method of the opening 362 includes, but not limited to, a dry etching method. Alternatively, a wet etching method or a combination of dry etching and wet etching can be employed for formation of the opening 362. The etching step for forming the opening 362 reduces the thickness of the oxide semiconductor layer 308c in some cases.

After that, heat treatment is preferably performed. By the heat treatment, part of oxygen contained in the oxide insulating layer 312 can be transferred to the oxide semiconductor layer 308a, so that oxygen vacancies in the oxide semiconductor layer 308a can be filled. Consequently, oxygen vacancies in the oxide semiconductor layer 308a can be reduced, while oxygen vacancies in the oxide semiconductor layer 308c that is not in contact with the insulating layer 312 are not reduced. Thus, the amount of oxygen vacancies in the oxide semiconductor layer 308c is larger than that of oxygen vacancies in the oxide semiconductor layer 308a. The heat treatment can be performed under conditions similar to those for the heat treatment performed after the formation of the oxide semiconductor layers 308a and 308c.

Next, the insulating layer 314 is formed over the insulating layer 312 and the oxide semiconductor layer 308c so as to cover the opening 362. Forming the insulating layer 314 changes the oxide semiconductor layer 308c into the oxide semiconductor layer 308b (see FIG. 4B).

The insulating layer 314 contains hydrogen. When hydrogen in the insulating layer 314 is diffused to the oxide semiconductor layer 308c, hydrogen is bonded to oxygen vacancies in the oxide semiconductor layer 308c and electrons serving as carriers are generated. As a result, the oxide semiconductor layer 308c has a reduced resistivity to form the oxide semiconductor layer 308b.

The resistivity of the oxide semiconductor layer 308b is lower than at least the resistivity of the oxide semiconductor layer 308a and is preferably higher than or equal to $1 \times 10^{-3}$ $\Omega \cdot cm$ and lower than $1 \times 10^{4}$ $\Omega \cdot cm$, more preferably higher than or equal to $1 \times 10^{-3}$ $\Omega \cdot cm$ and lower than $1 \times 10^{-1}$ $\Omega \cdot cm$. Note that the insulating layer 314 also has an advantageous effect of preventing an external impurity such as water, alkali metal, or alkaline earth metal, from diffusing into the oxide semiconductor layer 308a included in the transistor 102.

For example, the insulating layer 314 can be formed using a silicon nitride film, a silicon nitride oxide film, or the like having a thickness in the range from 50 nm to 400 nm. In this embodiment, the insulating layer 314 is formed using a silicon nitride film having a thickness of 100 nm.

The silicon nitride film is preferably formed at a high temperature to have an improved blocking property; for example, the silicon nitride film is preferably formed at a temperature in the range from the substrate temperature of 100° C. to the strain point of the substrate, more preferably at a temperature in the range from 300° C. to 400° C. When the silicon nitride film is formed at a high temperature, a phenomenon in which oxygen is released from the oxide semiconductor layer 308a and the carrier concentration is increased is caused in some cases; therefore, the upper limit of the temperature is a temperature at which the phenomenon is not caused.

The capacitor 105 is formed concurrently with the oxide semiconductor layer 308b. The capacitor 105 includes a dielectric layer between a pair of electrodes. One of the pair of electrodes is formed using the conductive layer 304b, and the other electrode is formed using the oxide semiconductor layer 308b. The insulating layers 305 and 306 serve as the dielectric layer of the capacitor 105.

Figure 4C:
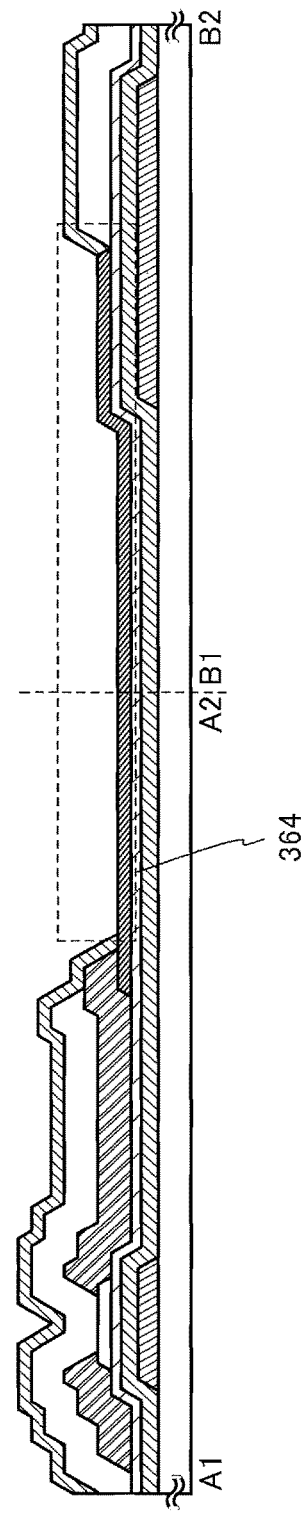

Next, the insulating layer 314 is processed into a desired shape, so that an opening 364 is formed (see FIG. 4C).

The opening 364 is formed so as to expose the oxide semiconductor layer 308b. An example of a formation method of the opening 364 includes, but not limited to, a dry etching method. Alternatively, a wet etching method or a combination of dry etching and wet etching can be employed for formation of the opening 364. The etching step for forming the opening 364 reduces the thickness of the oxide semiconductor layer 308b in some cases.

The oxide semiconductor layer 308b that is exposed by the formation of the opening 364 serves as the pixel electrode and the one electrode of the capacitor.

Through the above steps, the transistor 102, the capacitor 105, and the pixel electrode can be formed over the same substrate.

Next, a structure that is formed below the substrate 342 provided so as to face the substrate 302 will be described below.

A film having a coloring property (hereinafter referred to as a coloring layer 346) is formed below the substrate 342. The coloring layer 346 serves as a color filter. Furthermore, a light-blocking layer 344 adjacent to the coloring layer 346 is formed below the lower surface of the substrate 342. The light-blocking layer 344 serves as a black matrix. The coloring layer 346 is not necessarily provided in the case where the display device is a monochrome display device, for example.

The coloring layer 346 is formed using a coloring film that can transmit light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used.

The light-blocking layer 344 has a function of blocking light in a particular wavelength range, and can be formed using a metal film, an organic insulating film including a black pigment, or the like.

An insulating layer 348 is formed below the coloring layer 346. The insulating layer 348 has a function of a planarization layer or a function of suppressing diffusion of impurities in the coloring layer 346 to the liquid crystal element side.

Next, a method for forming the structure below the substrate 342 provided so as to face the substrate 302 will be described below.

First, the substrate 342 is prepared. For materials of the substrate 342, the materials that can be used for the substrate 302 can be referred to. Then, the light-blocking layer 344 and the coloring layer 346 each are formed below the substrate 342 in a desired position with the use of any of various materials by a printing method, an inkjet method, an etching method using a photolithography technique, or the like.

Then, the insulating layer 348 is formed below the light-blocking layer 344 and the coloring layer 346. For the insulating layer 348, an organic insulating film of an acrylic resin or the like can be used. The insulating layer 348 can prevent an impurity or the like contained in the coloring layer 346 from diffusing to the liquid crystal layer 320 side, for example. Note that the insulating layer 348 is not necessarily formed.

Then, the conductive layer 350 is formed below the insulating layer 348. The conductive layer 350 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added. The conductive layer 350 can be formed by a sputtering method, for example.

Through the above steps, the structure below the substrate 342 can be formed.

Next, the alignment film 318 is formed over the substrate 302, specifically, over the insulating layer 314 and the oxide semiconductor layer 308b over the substrate 302. Furthermore, the alignment film 352 is formed below the substrate 342, specifically, below the conductive layer 350 below the substrate 342. The alignment films 318 and 352 can be formed by a rubbing method, an optical alignment method, or the like. After that, the liquid crystal layer 320 is formed between the substrates 302 and 342. The liquid crystal layer 320 can be formed by a dispenser method (a dropping method), or an injecting method in which liquid crystal is injected using a capillary action after the substrates 302 and 342 are bonded to each other.

Through the above steps, the display device illustrated in FIG. 2 can be fabricated.

Modification Example 1

Figure 5:
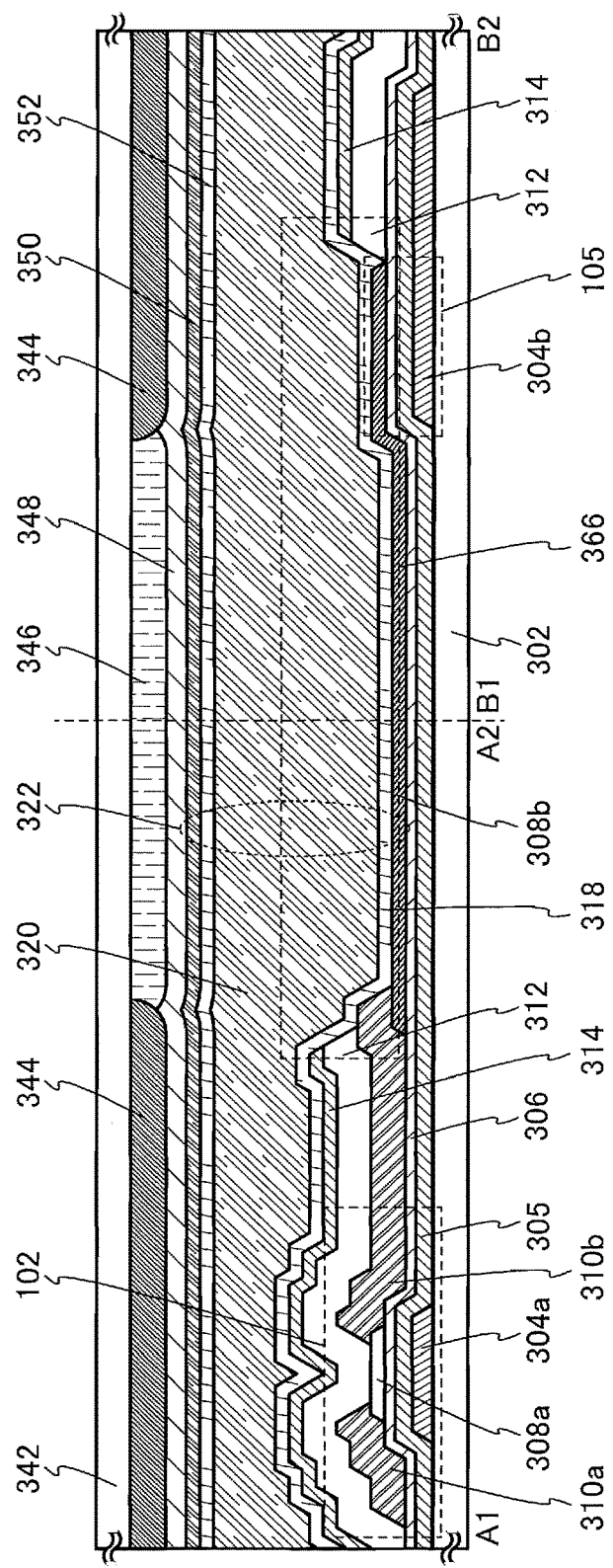
FIG. 5 is a cross-sectional views illustrating one embodiment of a display device.

Next, modification examples of the transistor 102, the capacitor 105, and a pixel electrode that are included in a display device will be described with reference to FIG. 5. FIG. 5 is a cross-sectional view illustrating a modification example of the display device in FIG. 2. Portions similar to those in FIG. 2 and portions having functions similar to those of portions in FIG. 2 are denoted by the same reference numerals, and the detailed descriptions thereof are omitted.

The display device in FIG. 5 is different from the display device in FIG. 2 in that an opening 366 is formed instead of the opening 362.

The opening 366 can be formed by etching the insulating layers 312 and 314 so that the oxide semiconductor layer 308b is exposed, after the insulating layers 312 and 314 are successively formed. Specifically, an example of a method for manufacturing the display device illustrated in FIG. 5 will be described with reference to FIGS. 3A to 3C and FIGS. 6A to 6C.

Method for Manufacturing Display Device
(Modification Example)

As in the manufacturing method described above, the conductive layers 310a and 310b and the insulating layer 312 are formed over the oxide semiconductor layers 308a and 308c (see FIG. 3C).

Then, the insulating layer 314 is formed over the insulating layer 312 (see FIG. 6A).

The insulating layers 312 and 314 are preferably formed successively in vacuum, in which case entry of impurities between the insulating layers 312 and 314 can be inhibited.

Next, the insulating layers 312 and 314 are processed into desired shapes, so that the opening 366 is formed (see FIG. 6B).

The opening 366 is formed so as to expose the oxide semiconductor layer 308c. An example of a formation method of the opening 366 includes, but not limited to, a dry etching method. Alternatively, a wet etching method or a combination of dry etching and wet etching can be employed for formation of the opening 366. The etching step for forming the opening 366 reduces the thickness of the oxide semiconductor layer 308c in some cases.

After that, heat treatment is preferably performed. By the heat treatment, part of oxygen contained in the insulating layer 312 can be transferred to the oxide semiconductor layer 308a, so that oxygen vacancies in the oxide semiconductor layer 308a can be filled. Consequently, the amount of oxygen vacancies in the oxide semiconductor layer 308a can be reduced, while oxygen vacancies in the oxide semiconductor layer 308c that is not in contact with the insulating layer 312 are not reduced. Thus, the amount of oxygen vacancies in the oxide semiconductor layer 308c is larger than that in the oxide semiconductor layer 308a. The heat treatment can be performed under conditions similar to those for the heat treatment performed after the formation of the oxide semiconductor layers 308a and 308c.

Next, plasma treatment is performed on the oxide semiconductor layer 308c. Specifically, plasma treatment is performed on the oxide semiconductor layer 308c and the insulating layer 314, so that the oxide semiconductor layer 308c becomes the oxide semiconductor layer 308b having an increased amount of oxygen vacancies and/or an increased impurity concentration (see FIG. 6C).

The arrows in FIG. 6C schematically denote the plasma treatment. The vicinity of surfaces of the oxide semiconductor layer 308b and the insulating layer 314 is irradiated with plasma. As the plasma treatment, plasma treatment using a gas containing one of a rare gas (He, Ne, Ar, Kr, or Xe), hydrogen, and nitrogen is typical. Specifically, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, plasma treatment in a nitrogen atmosphere, or the like can be employed.

By the above plasma treatment, the amount of oxygen vacancies in the oxide semiconductor layer 308c is increased because of plasma damage or gas species used in the plasma treatment is introduced into the oxide semiconductor layer 308c, the resistance of the oxide semiconductor layer 308c is reduced. Accordingly, the oxide semiconductor layer 308c becomes the oxide semiconductor layer 308b.

Note that a plasma CVD apparatus, an ashing apparatus, a sputtering apparatus, an etching apparatus, or the like can be used for the plasma treatment. In this embodiment, the plasma treatment is performed using a plasma CVD apparatus in an Ar atmosphere under the following conditions; the treatment pressure is 200 Pa; the power of an RF power source in the 27 MHz band is 1 kW; the treatment time is 300 sec; and the treatment temperature is 350° C.

Note that a surface of the oxide semiconductor layer 308a is protected by the insulating layers 312 and 314 when the plasma treatment illustrated in FIG. 6C is performed. Thus, the surface of the oxide semiconductor layer 308a is not exposed to plasma in the plasma treatment, and an increase in oxygen vacancies and/or hydrogen concentration can be thus inhibited. In other words, the oxide semiconductor layer 308a can be i-type or substantially i-type.

Modification Example 2

Next, in a display device illustrated in FIG. 7A, the oxide semiconductor layer 308a used for the transistor 102 in the display device has a layered structure of an oxide semiconductor layer 307a and an oxide semiconductor layer 309a. Further, in the display device illustrated in FIG. 7A, the oxide semiconductor layer 308a used for the transistor 102 in the display device has a layered structure of an oxide semiconductor layer 307a and an oxide semiconductor layer 309a. Thus, the other components are the same as those of the display device illustrated in FIG. 2; hence, the above description can be referred to.

A metal oxide of the oxide semiconductor layers 307a and 307b (in this specification below, also referred to as the oxide semiconductor layer 307) and a metal oxide of the oxide semiconductor layers 309a and 309b (in this specification below, also referred to as an oxide semiconductor layer 309) preferably have at least one metal element in common. Furthermore, the constituent elements of the oxide semiconductor layer 307 and the oxide semiconductor layer 309 may be the same and the compositions of the constituent elements of the oxide semiconductor layer 307 and the oxide semiconductor layer 309 may be different from each other.

In the case where the oxide semiconductor layer 307 is an In-M-Zn oxide (M represents Al, Ti, Ga, Y, Zr, La, Ce, Nd or Hf), it is preferable that the atomic ratio of metal elements of a sputtering target used for forming a film of the In-M-Zn oxide satisfy In≥M and Zn≥M. As the atomic ratio of metal elements of the sputtering target, In:M:Zn=1:1:1, In:M:Zn=5:5:6 (1:1:1.2), and In:M:Zn=3:1:2 are preferable. Note that the atomic ratio of metal elements in the oxide semiconductor layer 307 formed using the above sputtering target varies from that of the metal elements in the above sputtering target within a range of ±20% as an error.

In the case of using an In-M-Zn oxide for the oxide semiconductor layer 307, when Zn and O are eliminated from consideration, the proportion of In and the proportion of M are preferably greater than or equal to 25 atomic % and less than 75 atomic %, respectively, more preferably greater than or equal to 34 atomic % and less than 66 atomic %, respectively.

The energy gap of the oxide semiconductor layer 307 is 2 eV or more, preferably 2.5 eV or more, more preferably 3 eV or more. The off-state current of the transistor 102 can be reduced by using an oxide semiconductor having such a wide energy gap.

The thickness of the oxide semiconductor layer 307 is greater than or equal to 3 nm and less than or equal to 200 nm, preferably greater than or equal to 3 nm and less than or equal to 100 nm, more preferably greater than or equal to 3 nm and less than or equal to 50 nm.

The oxide semiconductor layer 309 is typically an In—Ga oxide, an In—Zn oxide, or an In-M-Zn oxide (M represents Al, Ti, Ga, Y, Zr, La, Ce, Nd or Hf). The energy of the bottom of the conduction band in the oxide semiconductor layer 309 is closer to a vacuum level than that of the oxide semiconductor layer 307 is, and typically, the difference between the energy of the bottom of the conduction band in the oxide semiconductor layer 309 and the energy of the bottom of the conduction band in the oxide semiconductor layer 307 is 0.05 eV or more, 0.07 eV or more, or 0.1 eV or more, and 0.15 eV or more, and 2 eV or less, 1 eV or less, 0.5 eV or less, or 0.4 eV or less. That is, the difference between the electron affinity of the oxide semiconductor layer 309 and the electron affinity of the oxide semiconductor layer 307 is 0.05 eV or more, 0.07 eV or more, 0.1 eV or more, or 0.15 eV or more, and 2 eV or less, 1 eV or less, 0.5 eV or less, or 0.4 eV or less.

The oxide semiconductor layer 309 containing a larger amount of the element M in an atomic ratio than the amount of In in an atomic ratio may have any of the following effects:

(1) the energy gap of the oxide semiconductor layer 309 is wide;
(2) the electron affinity of the oxide semiconductor layer 309 is low;
(3) an impurity from the outside is blocked;
(4) the insulating property is more excellent than that of the oxide semiconductor layer 307.

Furthermore, oxygen vacancies are less likely to be generated in the oxide semiconductor layer 309 containing a larger amount of M in an atomic ratio than the amount of In in an atomic ratio because M is a metal element strongly bonded to oxygen.

In the case of using an In-M-Zn oxide for the oxide semiconductor layer 309, when Zn and O are eliminated from consideration, the proportion of In and the proportion of M are preferably less than 50 atomic % and greater than or equal to 50 atomic %, respectively, more preferably less than 25 atomic % and greater than or equal to 75 atomic %, respectively.

In the case where each of the oxide semiconductor layer 307 and the oxide semiconductor layer 309 is In-M-Zn oxide (M represents Al, Ti, Ga, Y, Zr, La, Ce, Nd or Hf), the proportion of M atoms in the oxide semiconductor layer 309 is higher than the proportion of M atoms in the oxide semiconductor layer 307. Typically, the proportion of M atoms in the oxide semiconductor layer 309 is more than or equal to 1.5 times, preferably more than or equal to 2 times, more preferably more than or equal to 3 times as high as that in the oxide semiconductor layer 307.

In the case where the oxide semiconductor layer 309 has an atomic ratio of In to M and Zn that is $x_1:y_1:z_1$ and the oxide semiconductor layer 307 has an atomic ratio of In to M and Zn that is $x_2:y_2:z_2$, $y_1/x_1$ is larger than $y_2/x_2$, preferably $y_1/x_1$ is more than or equal to 1.5 times as large as $y_2/x_2$, more preferably $y_1/x_1$ is more than or equal to 2 times as large as $y_2/x_2$, still more preferably $y_1/x_1$ is more than or equal to three times as large as $y_2/x_2$. In this case, it is preferable that in the oxide semiconductor layer, $y_2$ be higher than or equal to $x_2$ because a transistor including the oxide semiconductor film can have stable electric characteristics. In this case, it is preferable that in the oxide semiconductor layer, $y_2$ be higher than or equal to $x_2$ because the transistor 102 including the oxide semiconductor layer can have stable electric characteristics. However, when $y_2$ is higher than or equal to three times $x_2$, the field-effect mobility of the transistor 102 including the oxide semiconductor layer is reduced. Thus, it is preferable that $y_2$ be lower than three times $x_2$.

In the case where the oxide semiconductor layer 309 is an In-M-Zn oxide, it is preferable that the atomic ratio of metal elements of a sputtering target used for forming a film of the In-M-Zn oxide satisfy M>In and Zn≥M. As the atomic ratio of metal elements of the sputtering target, In:Ga:Zn=1:3:2, In:Ga:Zn=1:3:3, In:Ga:Zn=1:3:4, In:Ga:Zn=1:3:5, In:Ga:Zn=1:3:6, In:Ga:Zn=1:3:7, In:Ga:Zn=1:3:8, In:Ga:Zn=1:3:9, In:Ga:Zn=1:3:10, In:Ga:Zn=1:6:4, In:Ga:Zn=1:6:5, In:Ga:Zn=1:6:6, In:Ga:Zn=1:6:7, In:Ga:Zn=1:6:8, In:Ga:Zn=1:6:9, and In:Ga:Zn=1:6:10 are preferable. Note that the atomic ratio of metal elements in each of the oxide semiconductor layers 307 and 309 formed using the above sputtering target varies from that of the metal elements in the above sputtering target within a range of ±20% as an error.

Note that the composition is not limited to those described above, and a material having the appropriate composition may be used depending on needed semiconductor characteristics and electrical characteristics (e.g., field-effect mobility and threshold voltage) of the transistor. In order to obtain the required semiconductor characteristics of the transistor, it is preferable that the carrier density, the impurity concentration, the defect density, the atomic ratio of a metal element to oxygen, the interatomic distance, the density, and the like of the oxide semiconductor layer 307 be set to appropriate values.

The oxide semiconductor layer 309 also functions as a film that relieves damage to the oxide semiconductor layer 307 at the time of forming the insulating layers 312 and 314 later. The thickness of the oxide semiconductor layer 309 is greater than or equal to 3 nm and less than or equal to 100 nm, preferably greater than or equal to 3 nm and less than or equal to 50 nm.

When silicon or carbon, which is one of Group 14 elements, is contained in the oxide semiconductor layer 307a in the transistor 102, the amount of oxygen vacancies is increased, and the oxide semiconductor layer 307a becomes n-type. Thus, the concentration of silicon or carbon (the concentration is measured by SIMS) in the oxide semiconductor layer 307a or the concentration of silicon or carbon (the concentration is measured by SIMS) in the vicinity of the interface between the oxide semiconductor layer 309a and the oxide semiconductor layer 307a is set to be lower than or equal to $2\times10^{18}$ atoms/cm$^3$, preferably lower than or equal to $2\times10^{17}$ atoms/cm$^3$.

Furthermore, the concentration of alkali metal or alkaline earth metal of the oxide semiconductor layer 307a, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor layer 307a.

When containing nitrogen, the oxide semiconductor layer 307a easily becomes n-type because of generation of electrons serving as carriers and an increase in carrier density. Thus, a transistor including an oxide semiconductor that contains nitrogen is likely to be normally on. For this reason, nitrogen in the oxide semiconductor film is preferably reduced as much as possible; the nitrogen concentration measured by SIMS is preferably set to, for example, lower than or equal to $5\times10^{18}$ atoms/cm$^3$.

Note that in the transistor 102 illustrated in FIG. 7A, the oxide semiconductor layer 309a is provided between the oxide semiconductor layer 307a and the insulating layer 312. The oxide semiconductor layer 307a is positioned on the conductive layer 304a side (the conductive layer 304a serves as a gate electrode) and serves as a main path of carriers. Hence, if trap states are formed between the oxide semiconductor layer 309a and the insulating layer 312 owing to impurities and defects, electrons flowing in the oxide semiconductor layer 307a are less likely to be captured by the trap states because there is a distance between the trap states and the oxide semiconductor layer 307a.

Accordingly, the amount of on-state current of the transistor 102 can be increased, and the field-effect mobility can be increased. When the electrons are captured by the trap states, the electrons become negative fixed charge. Consequently, the threshold voltage of the transistor 102 is changed. However, the distance between the oxide semiconductor layer 307a and the trap states enables reducing capture of the electrons by the trap states, and accordingly a change in the threshold voltage can be reduced.

Note that the oxide semiconductor layers 307a to 309a are not formed by simply stacking layers but are formed to have a continuous energy band (here, in particular, a structure in which energies of the bottoms of the conduction bands are changed continuously between the layers). In other words, the oxide semiconductor layers have a layered structure such that there exists no impurities that forms a defect level such as a trap center or a recombination center at each interface. If an impurity exists between the stacked oxide semiconductor layers 307a and 309a, continuity of the energy band is lost, and thus carriers are trapped or disappear by recombination at the interface.

In order to form such a continuous energy band, layers need to be successively formed without being exposed to the air, with use of a multi-chamber deposition apparatus (sputtering apparatus) including a load lock chamber. Each chamber in the sputtering apparatus is preferably evacuated to be a high vacuum (to the degree of approximately $5 \times 10^{-7}$ Pa to $1 \times 10^{-4}$ Pa) by an entrapment vacuum pump such as a cryopump so that water and the like as impurities of the oxide semiconductor layer are removed as much as possible. Alternatively, a turbo molecular pump and a cold trap are preferably combined so as to prevent a backflow of a gas, especially a gas containing carbon or hydrogen, from an exhaust system to the inside of the chamber.

Here, a band structure of the layered structure in the transistor 102 will be described with reference to FIG. 7B.

FIG. 7B schematically shows part of a band structure in the transistor 102. Here, the case where silicon oxide layers are provided as the insulating layers 306 and 312 is shown. In FIG. 7B, EcI1 denotes the energy of the bottom of the conduction band in the silicon oxide layer that is used as the insulating layer 306; EcS1 denotes the energy of the bottom of the conduction band in the oxide semiconductor layer 307a; EcS2 denotes the energy of the bottom of the conduction band in the oxide semiconductor layer 309a; and EcI2 denotes the energy of the bottom of the conduction band in the silicon oxide layer that is used as the insulating layer 312.

As shown in FIG. 7B, there is no energy barrier between the oxide semiconductor layers 307a and 309a, and the energy level of the bottom of the conduction band is changed smoothly, or continuously. This is because the oxide semiconductor layers 307a and 309a contain a common element and oxygen is transferred between the oxide semiconductor layers 307a and 309a, so that a mixed layer is formed.

As shown in FIG. 7B, the oxide semiconductor layer 307a in the oxide semiconductor layer 308a serves as a well and a channel region of the transistor including the oxide semiconductor layer 308a is formed in the oxide semiconductor layer 307a. Note that since the energy of the bottom of the conduction band of the oxide semiconductor layer 308a is continuously changed, it can be said that the oxide semiconductor layers 307a and 309a are continuous.

Although trap levels due to impurities or defects might be formed in the vicinity of the interface between the oxide semiconductor layer 309a and the insulating layer 312 as shown in FIG. 7B, the oxide semiconductor layer 307a can be distanced from the trap levels owing to existence of the oxide semiconductor layer 309a. However, in the case where an energy difference between EcS1 and EcS2 is small, electrons in the oxide semiconductor layer 307a might reach the trap state by passing over the energy gap. When the electrons are captured by the trap level, negative fixed charge is generated at the interface with the insulating layer 312, whereby the threshold voltage of the transistor shifts in the positive direction. Therefore, it is preferable that the energy difference between EcS1 and EcS2 be 0.1 eV or more, more preferably 0.15 eV or more because a change in the threshold voltage of the transistor is prevented and stable electrical characteristics are obtained.

In the structure illustrated in FIG. 7A, one electrode of the capacitor 105 and the pixel electrode each have a layered structure of the oxide semiconductor layers 307b and 309b. Hydrogen diffusion from the insulating film in contact with the oxide semiconductor layer 309b or impurity implantation and/or diffusion by plasma treatment improves the conductivity of the layered structure of the oxide semiconductor layers 307b and 309b. Thus, the oxide semiconductor layers 307b and 309b serve as the one electrode of the capacitor 105 and the pixel electrode.

Modification Example 3

Next, a structural example of a display device of one embodiment of the present invention in which a light-emitting element is used as a display element will be described with reference to FIG. 8. Note that FIG. 8 is a cross-sectional view of a modification example of the display device illustrated in FIG. 2; thus, portions similar to those in FIG. 2 and portions having functions similar to those of portions in FIG. 2 are denoted by the same reference numerals, and the detailed descriptions thereof are omitted.

Figure 8:
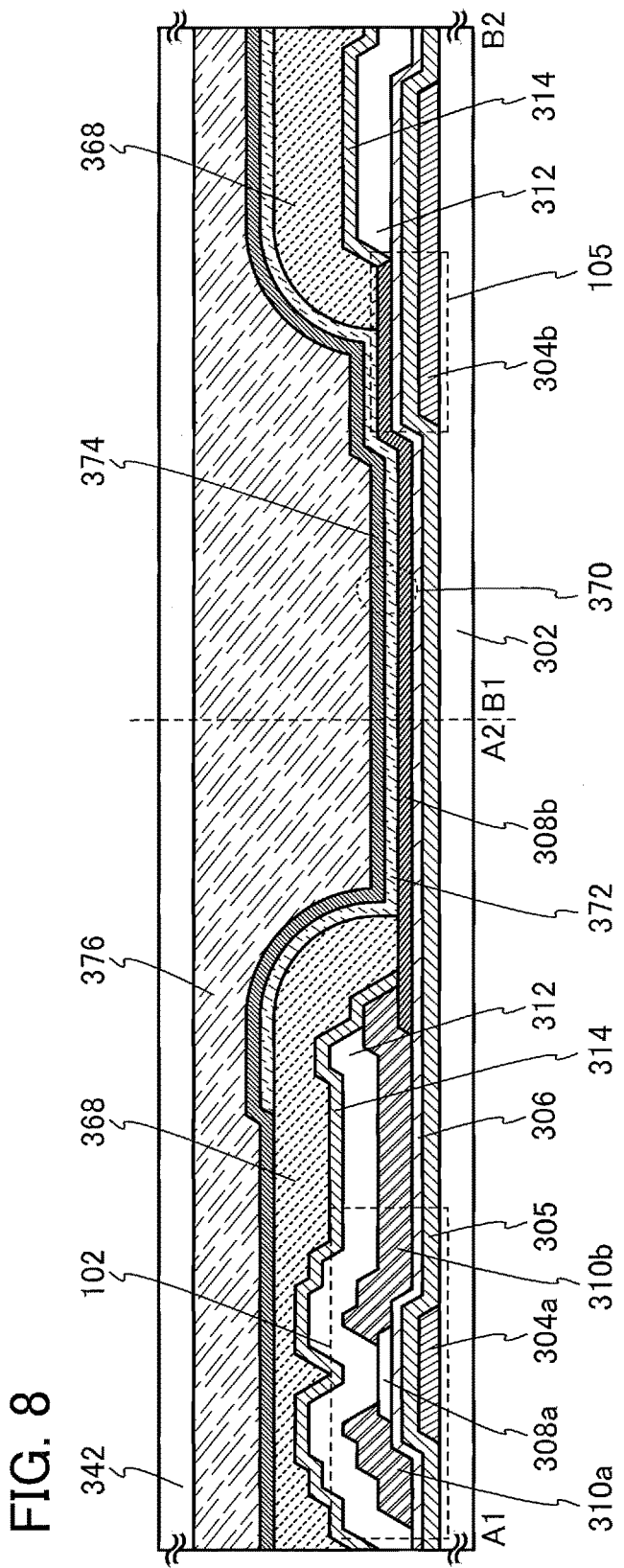
FIG. 8 is a cross-sectional view illustrating one embodiment of a display device.

The display device in FIG. 8 is different from the display device in FIG. 2 in that a light-emitting element 370 is provided instead of the liquid crystal element 322. The light-emitting element 370 has a light-emitting layer between a pair of electrodes. Specifically, the light-emitting element 370 includes the oxide semiconductor layer 308b serving as one of the pair of electrodes and the pixel electrode, an electrode 374 serving as the other electrode, and a light-emitting layer 372 interposed between the pair of electrodes.

As the light-emitting element 370, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter as an inorganic EL element. A structure in FIG. 8 where an organic EL element is used as the light-emitting element 370 will be described below.

In an organic EL element, by application of a voltage to a light-emitting element, electrons and holes are separately injected from a pair of electrodes into a layer containing a light-emitting organic compound, and a current flows. The electrons and holes (i.e., carriers) are recombined; thus, the light-emitting organic compound becomes in an excited state. The light-emitting organic compound returns to a ground state from the excited state, thereby emitting light. Based on such a mechanism, such a light-emitting element is referred to as a current-excitation type light-emitting element.

To extract light emitted from the light-emitting element, it is necessary that at least one of the pair of electrodes has a light-transmitting property. A transistor and the light-emitting element are formed over a substrate. Any of light-emitting elements having the following structures can be used as the light-emitting element: a top-emission structure in which light is extracted through the surface opposite to the substrate, a bottom-emission structure in which light is extracted through the surface of the substrate, and a dual-emission structure in which light is extracted through the surface opposite to the substrate and the surface of the substrate.

The display device in FIG. 8 is what is called a bottom-emission display device in which light can be extracted from the substrate 302 side. Thus, the oxide semiconductor layer 308b serving as one of the pair of electrodes of the light-emitting element 370 transmits light. The electrode 374 serving as the other electrode of the light-emitting element 370 reflects light.

The light-emitting element 370 serving as a display element is electrically connected to the transistor 102. Although the light-emitting element 370 in FIG. 8 has a layered structure of the oxide semiconductor layer 308b serving as the pixel electrode, the light-emitting layer 372, and the electrode 374, the structure of the light-emitting element 370 is not limited to this structure. For example, the structure of the light-emitting element 370 can be changed as appropriate depending on, for example, the direction in which light is extracted from the light-emitting layer 372.

The light-emitting layer 372 can be formed to have either a single-layer structure or layered structure including a plurality of layers.

A protective film may be formed over the electrode 374 in order to prevent entry of oxygen, hydrogen, moisture, carbon dioxide, or the like into the light-emitting element 370. As the protective film, a silicon nitride film, a silicon nitride oxide film, an aluminum oxide film, or the like can be formed. In addition, a space formed between the substrates 302 and 342 is provided with a filler 376 and sealed. It is preferable that the light-emitting element be packaged (sealed) with a cover material or a protective film (such as a laminate film or an ultraviolet curable resin film) with high air-tightness and little degasification so that the light-emitting element is not exposed to the outside air, in this manner.

Furthermore, in the display device in FIG. 8, a partition 368 is provided over the insulating layer 314 so as to cover an outer portion of the oxide semiconductor layer 308b.

The partition 368 can be formed using an organic resin or an inorganic insulating material. As the organic resin, for example, a polyimide resin, a polyamide resin, an acrylic resin, a siloxane resin, an epoxy resin, a phenol resin, or the like can be used. As the inorganic insulating material, silicon oxide, silicon oxynitride, or the like can be used. In particular, a photosensitive resin is preferably used to facilitate formation of the partition 368. Although FIG. 8 illustrates the structure where the partition 368 is provided, the structure is not necessarily employed. For example, a structure without the partition 368 may be employed.

The electrode 374 can be formed using a reflective conductive film, for example. The electrode 374 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

For the filler 376, an inert gas such as nitrogen or argon, or an ultraviolet curable resin or a thermosetting resin can be used. For example, a polyvinyl chloride (PVC) resin, an acrylic resin, a polyimide resin, an epoxy resin, a silicone resin, a polyvinyl butyral (PVB) resin, or an ethylene vinyl acetate (EVA) resin can be used for the filler. For example, nitrogen may be used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

As to the display device described in this embodiment, it is possible to simultaneously form the oxide semiconductor layer 308a serving as the channel formation region of the transistor and the oxide semiconductor layer 308b serving as the electrode of the capacitor and the pixel electrode. The oxide semiconductor layer 308a is in contact with layers each formed using a material capable of improving the property of the interface with the oxide semiconductor layer, such as the insulating layers 306 and 312; accordingly, the oxide semiconductor layer 308a serves as a semiconductor. Therefore, the transistor including the oxide semiconductor layer 308a has excellent electric characteristics. On the other hand, an impurity is implanted into the oxide semiconductor layer 308b serving as the pixel electrode and the one electrode of the capacitor by plasma treatment in an atmosphere containing hydrogen or diffusion of hydrogen from the insulating layer containing hydrogen. Thus, when hydrogen is diffused to the oxide semiconductor layer 308b, hydrogen is bonded to oxygen and electrons serving as carriers are generated in the oxide semiconductor layer 308b. Accordingly, the oxide semiconductor layer 308b can have an increased conductivity and serves as a conductor. That is, the oxide semiconductor layer 308b can also be referred to as a highly conductive oxide semiconductor layer.

Further, as to the display device described in this embodiment, the one electrode of the capacitor is formed at the same time as the gate electrode of the transistor. In addition, the other electrode of the capacitor is formed at the same time as the oxide semiconductor layer of the transistor. Note that the other electrode of the capacitor also serves as the pixel electrode. The dielectric layer of the capacitor is formed at the same time as the gate insulating layer of the transistor. Thus, a step of further forming a conductive layer and/or a dielectric layer to form the capacitor and the pixel electrode is unnecessary, reducing the manufacturing steps of the display device. This enables the display device to be manufactured at low cost.

The structures, the methods, and the like described in this embodiment can be combined as appropriate with any of the structures, the methods, and the like described in the other embodiments.

Embodiment 2

In this embodiment, an example of an oxide semiconductor layer that can be used for the transistor, the electrode of the capacitor, and the pixel electrode described in Embodiment 1 will be described.

<Crystallinity of Oxide Semiconductor Layer>

A structure of an oxide semiconductor layer will be described below.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a c-axis aligned crystalline oxide semiconductor (CAAC-OS) film, and the like.

First, a CAAC-OS film will be described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification and the like, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal arrangement in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ does not appear at around 36°.

In this specification, the trigonal and rhombohedral crystal systems are included in the hexagonal crystal system.

The CAAC-OS film is an oxide semiconductor layer having a low impurity concentration. The impurity is an element other than the main components of the oxide semiconductor layer, such as hydrogen, carbon, silicon, and a transition metal element. In particular, an element that has higher bonding strength to oxygen than a metal element included in the oxide semiconductor layer, such as silicon, disturbs the atomic arrangement of the oxide semiconductor layer by depriving the oxide semiconductor layer of oxygen and causes a decrease in crystallinity. Further, heavy metals such as iron and nickel, argon, carbon dioxide, and the like each have a large atomic radius (molecular radius), and thus disturb the atomic arrangement of the oxide semiconductor layer and causes a decrease in crystallinity when any of them is contained in the oxide semiconductor layer. Note that the impurity contained in the oxide semiconductor layer might serve as a carrier trap or a carrier generation source.

Further, the CAAC-OS film is an oxide semiconductor layer having a low density of defect states.

In a transistor using the CAAC-OS film, change in electric characteristics due to irradiation with visible light or ultraviolet light is small.

Next, a microcrystalline oxide semiconductor layer will be described.

In an image obtained with TEM, crystal parts cannot be found clearly in the microcrystalline oxide semiconductor layer in some cases. In most cases, the size of a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm or a size greater than or equal to 1 nm and less than or equal to 3 nm is specifically referred to as nanocrystal (nc). An oxide semiconductor layer including a nanocrystal is referred to as a nanocrystalline oxide semiconductor (nc-OS) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than a crystal part, a peak which shows a crystal plane does not appear. Further, a halo pattern is shown in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film which is obtained by using an electron beam having a probe diameter (e.g., larger than or equal to 1 nm and smaller than or equal to 30 nm) close to, or smaller than or equal to the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor layer having more regularity than the amorphous oxide semiconductor layer; thus, the nc-OS film has a lower density of defect levels than the amorphous oxide semiconductor layer. However, there is no regularity of crystal orientation between different crystal parts in the nc-OS film; hence, the nc-OS film has a higher density of defect states than the CAAC-OS film.

Note that an oxide semiconductor layer may be a stack including two or more of an amorphous oxide semiconductor layer, a microcrystalline oxide semiconductor layer, and a CAAC-OS film, for example.

<Formation Method of CAAC-OS Film>

For example, a CAAC-OS film can be deposited by a sputtering method using a polycrystalline oxide semiconductor sputtering target. When ions collide with the sputtering target, a crystal region included in the sputtering target may be separated from the target along an a-b plane; in other words, sputtered particles each having a plane parallel to an a-b plane (flat-plate-like sputtered particles or pellet-like sputtered particles) may flake off from the sputtering target. In that case, the flat-plate-like or pellet-like sputtered particles reach a substrate while keeping its crystal state, whereby the CAAC-OS film can be formed over the substrate.

The flat-plate-like or pellet-like sputtered particle has, for example, an equivalent circle diameter of a plane parallel to the a-b plane of greater than or equal to 3 nm and less than or equal to 10 nm, and a thickness (a length in the direction perpendicular to the a-b plane) of greater than or equal to 0.7 nm and less than 1 nm. Note that in the flat-plate-like or pellet-like sputtered particle, the plane parallel to the a-b plane may be a regular triangle or a regular hexagon. Here, the term "equivalent circle diameter of a plane" refers to the diameter of a perfect circle having the same area as the plane.

For the deposition of the CAAC-OS film, the following conditions are preferably used.

By increasing the substrate temperature during the deposition, migration of sputtered particles is likely to occur after the sputtered particles reach a substrate surface. Specifically, the substrate temperature during the deposition is higher than or equal to 100° C. and lower than or equal to 740° C., preferably higher than or equal to 200° C. and lower than or equal to 500° C. By increasing the substrate temperature during the deposition, when the flat-plate-like or pellet-like sputtered particles reach the substrate, migration occurs on the substrate surface, so that flat planes of the flat-plate-like sputtered particles are attached to the substrate. At this time, the sputtered particles are charged positively, whereby the sputtered particles are attached to the substrate while repelling each other; thus, the sputtered particles do not overlap with each other randomly, and a CAAC-OS film with a uniform thickness can be deposited.

By reducing the mixing of impurities during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

Alternatively, the CAAC-OS film is formed by the following method.

First, a first oxide semiconductor layer is formed to a thickness of greater than or equal to 1 nm and less than 10 nm. The first oxide semiconductor layer is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Then, heat treatment is performed to increase the crystallinity of the first oxide semiconductor layer to give the first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment is performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor layer in a short time. At the same time, the heat treatment in an inert atmosphere may generate oxygen vacancies in the first oxide semiconductor layer. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor layer in a shorter time.

The first oxide semiconductor layer with a thickness of greater than or equal to 1 nm and less than 10 nm can be easily crystallized by heat treatment as compared to the case where the first oxide semiconductor layer has a thickness of greater than or equal to 10 nm.

Next, a second oxide semiconductor layer having the same composition as the first oxide semiconductor layer is formed to a thickness of greater than or equal to 10 nm and less than or equal to 50 nm. The second oxide semiconductor layer is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Then, heat treatment is performed so that solid phase growth of the second oxide semiconductor layer from the first CAAC-OS film occurs, whereby the second oxide semiconductor film is turned into a second CAAC-OS film having high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment is performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor layer in a short time. At the same time, the heat treatment in an inert atmosphere may generate oxygen vacancies in the second oxide semiconductor layer. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor layer in a shorter time.

As described above, a CAAC-OS film with a total thickness of greater than or equal to 10 nm can be formed. The CAAC-OS film can be favorably used as the oxide semiconductor layer in the oxide stack.

Next, a method for forming an oxide film in the case where a formation surface has a low temperature (e.g., a temperature lower than 130° C., lower than 100° C., or lower than 70° C., or approximately a room temperature (20° C. to 25° C.)) because, for example, the substrate is not heated will be described.

In the case where the formation surface has a low temperature, sputtered particles fall irregularly to the deposition surface. For example, migration does not occur; therefore, the sputtered particles are randomly deposited on the deposition surface including a region where other sputtered particles have been deposited. That is, an oxide film obtained by the deposition might have a non-uniform thickness and disordered crystal alignment. The oxide film obtained in the above manner maintains the crystallinity of the sputtered particles to a certain degree and thus has a crystal part (nanocrystal).

For example, in the case where the pressure at the deposition is high, the frequency with which the flying sputtered particle collides with another particle (e.g., an atom, a molecule, an ion, or a radical) of argon or the like is increased. When the flying sputtered particle collides with another particle (resputtered), the crystal structure of the sputtered particle might be broken. For example, when the sputtered particle collides with another particle, the plate-like shape of the sputtered particle cannot be kept, and the sputtered particle might be broken into parts (e.g., atomized). In that case, when atoms obtained from the sputtered particle are deposited on the formation surface, an amorphous oxide semiconductor film might be formed.

In the case where not a sputtering method using a target including a polycrystalline oxide but a deposition method using liquid or a method for depositing a film by vaporizing a solid such as a target is used, the atoms separately fly to be deposited on the formation surface; therefore, an amorphous oxide film might be formed. Furthermore, for example, by a laser ablation method, atoms, molecules, ions, radials, clusters, or the like released from the target flies to be deposited on the formation surface; therefore, an amorphous oxide film might be formed.

An oxide semiconductor layer included in the transistor of one embodiment of the present invention may have any of the above crystal states. Furthermore, in the case of stacked oxide semiconductor layers, the crystal states of the oxide semiconductor layers may be different from each other. Note that a CAAC-OS film is preferably used for the oxide semiconductor layer serving as a channel of the transistor. Further, an oxide semiconductor layer included in the capacitor has a higher impurity concentration than the oxide semiconductor layer included in the transistor; thus, the crystallinity is lowered in some cases.

The structures, the methods, and the like described in this embodiment can be combined as appropriate with any of the structures, the methods, and the like described in the other embodiments.

Embodiment 3

In this embodiment, a display device of one embodiment of the present invention will be described with reference to drawings. Note that portions similar to those in the above embodiments and portions having functions similar to those in the above embodiments are given the same reference numerals, and detailed descriptions thereof are omitted.

Figure 9A:
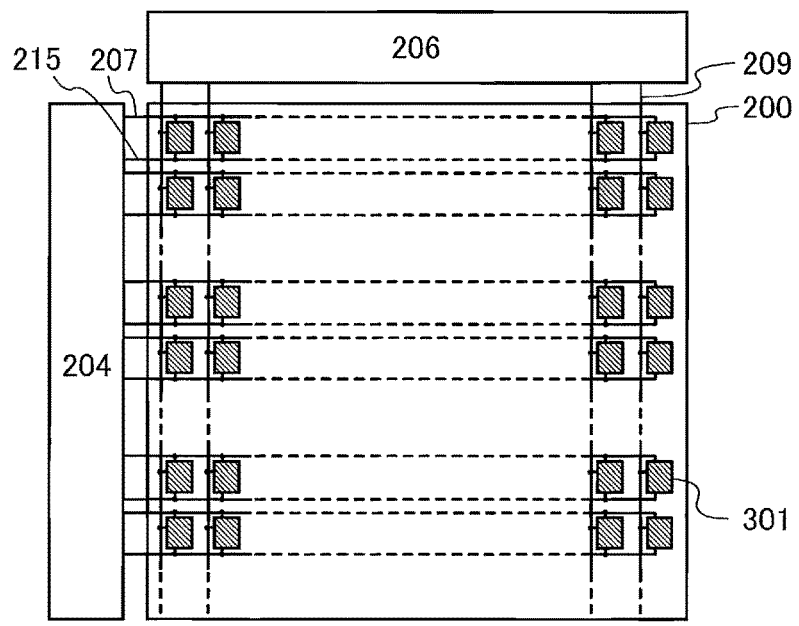
FIGS. 9A to 9C are a block diagram and circuit diagrams illustrating embodiments of display devices.

FIG. 9A illustrates an example of a display device. The display device in FIG. 9A includes a pixel portion 200, a scan line driver circuit 204, a signal line driver circuit 206, m scan lines 207 that are arranged in parallel or substantially in parallel and whose potentials are controlled by the scan line driver circuit 204, and n signal lines 209 that are arranged in parallel or substantially in parallel and whose potentials are controlled by the signal line driver circuit 206. The pixel portion 200 includes a plurality of pixels 301 arranged in a matrix. Capacitor lines 215 that are arranged in parallel or substantially in parallel to the scan lines 207 are also provided. The capacitor lines 215 may be arranged in parallel or substantially in parallel to the signal lines 209. The scan line driver circuit 204 and the signal line driver circuit 206 may be collectively referred to as a driver circuit portion.

Each scan line 207 is electrically connected to the n pixels 301 in the corresponding row among the pixels 202 arranged in m rows and n columns in the pixel portion 200. Each signal line 209 is electrically connected to the m pixels 301 in the corresponding column among the pixels 301 arranged in m rows and n columns. Note that m and n are each an integer of 1 or more. Each capacitor line 215 is electrically connected to the n pixels 301 in the corresponding row among the pixels 301 arranged in m rows and n columns. Note that in the case where the capacitor lines 215 are arranged in parallel or substantially in parallel along the signal lines 209, each capacitor line 215 is electrically connected to the m pixels 301 in the corresponding column among the pixels 301 arranged in m rows and n columns.

The display device described in Embodiment 1 can be used for the pixel 301 illustrated in FIG. 9A.

Figure 9B:
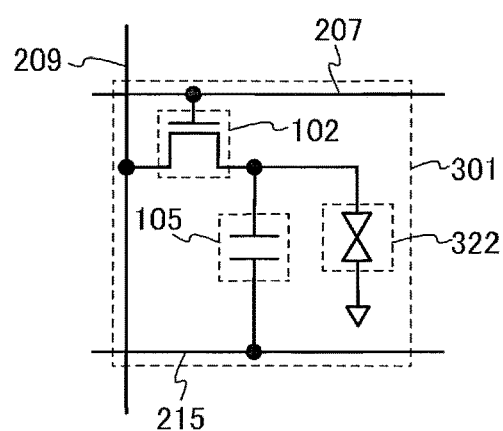
Figure 9C:
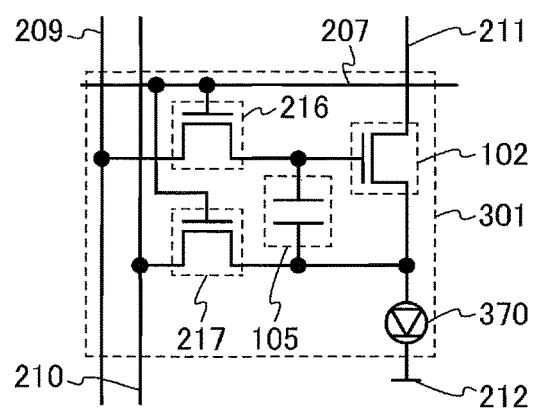

FIGS. 9B and 9C illustrate circuit configurations that can be used for the pixels 301 in the display device illustrated in FIG. 9A.

The pixel 301 illustrated in FIG. 9B includes the liquid crystal element 322, the transistor 102, and the capacitor 105.

The potential of one of a pair of electrodes of the liquid crystal element 322 is set in accordance with the specifications of the pixel 301 as appropriate. The alignment state of the liquid crystal element 322 depends on written data. A common potential may be supplied to one of the pair of electrodes of the liquid crystal element 322 included in each of the plurality of pixels 301. The potential supplied to one of a pair of electrodes of the liquid crystal element 322 in each of the pixels 301 in one row may be different from the potential supplied to one of a pair of electrodes of the liquid crystal element 322 in each of the pixels 301 in another row.

The liquid crystal element 322 is an element that controls transmission and non-transmission of light by the optical modulation action of liquid crystal. Note that the optical modulation action of a liquid crystal is controlled by an electric field applied to the liquid crystal (including a horizontal electric field, a vertical electric field, and an oblique electric field). Note that any of the following can be used for the liquid crystal element 322: nematic liquid crystal, cholesteric liquid crystal, smectic liquid crystal, discotic liquid crystal, thermotropic liquid crystal, lyotropic liquid crystal, low-molecular liquid crystal, high-molecular liquid crystal, ferroelectric liquid crystal, anti-ferroelectric liquid crystal, main-chain liquid crystal, side-chain high-molecular liquid crystal, a banana-shaped liquid crystal, and the like.

Examples of a driving method of the display device including the liquid crystal element 322 include a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to them, and any of various liquid crystal elements and driving methods can be used as a liquid crystal element and a driving method thereof.

The liquid crystal element may be formed using a liquid crystal composition including liquid crystal exhibiting a blue phase and a chiral material. The liquid crystal exhibiting a blue phase has a short response time of 1 msec or less, and is optically isotropic, which makes the alignment process unneeded and the viewing angle dependence small.

In the pixel 301 illustrated in FIG. 9B, one of a source electrode and a drain electrode of the transistor 102 is electrically connected to the signal line 209, and the other is electrically connected to the other of a pair of electrodes of the liquid crystal element 322. A gate electrode of the transistor 102 is electrically connected to the scan line 207. The transistor 102 has a function of controlling whether to write a data signal by being turned on or off.

In the structure of the pixel 301 illustrated in FIG. 9B, one of a pair of electrodes of the capacitor 105 is electrically connected to the capacitor line 215 to which a potential is supplied, and the other is electrically connected to the other of the pair of electrodes of the liquid crystal element 322. The potential of the capacitor line 215 is set in accordance with the specifications of the pixel 301 as appropriate. The capacitor 105 serves as a storage capacitor for storing written data.

For example, in the display device including the pixel 301 in FIG. 9B, the pixels 301 are sequentially selected row by row by the scan line driver circuit 204, whereby the transistors 102 are turned on and a data signal is written.

When the transistors 102 are turned off, the pixels 301 to which the data has been written are brought into a holding state. This operation is performed row by row sequentially; thus, an image can be displayed.

The pixel 301 illustrated in FIG. 9C includes a transistor 216 that performs switching of a display element, the transistor 102 that controls driving of the pixel, a transistor 217, the capacitor 105, and the light-emitting element 370. For example, one embodiment of the display device illustrated in FIG. 8 can be used for the transistor 102 that controls driving of the pixel, the capacitor 105, and the light-emitting element 370.

One of a source electrode and a drain electrode of the transistor 216 is electrically connected to the signal line 209 to which a data signal is supplied. The gate electrode of the transistor 102 is electrically connected to the scan line 207 to which a gate signal is supplied.

The transistor 216 has a function of controlling whether to write a data signal by being turned on or off.

The one of the source electrode and the drain electrode of the transistor 102 is electrically connected to a wiring 211 serving as an anode line, and the other of the source electrode and the drain electrode of the transistor 102 is electrically connected to one electrode of the light-emitting element 370. The gate electrode of the transistor 102 is electrically connected to the other of the source electrode and the drain electrode of the transistor 216 and the one electrode of the capacitor 105.

The transistor 102 has a function of controlling a current that flows to the light-emitting element 370 by being turned on or off.

One of a source electrode and a drain electrode of the transistor 217 is electrically connected to a wiring 210 to which a reference potential of data is supplied, and the other of the source electrode and the drain electrode of the transistor 217 is electrically connected to the one electrode of the light-emitting element 370 and the other electrode of the capacitor 105. A gate electrode of the transistor 217 is electrically connected to the scan line 207 to which a gate signal is supplied.

The transistor 217 has a function of adjusting a current that flows to the light-emitting element 370. For example, in the case where the internal resistance of the light-emitting element 370 is increased because of its deterioration, a current that flows to the wiring 210 electrically connected to the one of the source electrode and the drain electrode of the transistor 217 is monitored so that a current that flows to the light-emitting element 370 can be adjusted. A potential that is supplied to the wiring 210 can be, for example, 0 V.

The one of the pair of electrodes of the capacitor 105 is electrically connected to the other of the source electrode and the drain electrode of the transistor 102 and the gate electrode of the transistor 216. The other of the pair of electrodes of the capacitor 105 is electrically connected to the other of the source electrode and the drain electrode of the transistor 217 and the one electrode of the light-emitting element 370.

In the structure of the pixel 301 illustrated in FIG. 9C, the capacitor 105 serves as a storage capacitor that holds written data.

The one of the pair of electrodes of the light-emitting element 370 is electrically connected to the other of the source electrode and the drain electrode of the transistor 217, the other electrode of the capacitor 105, and the other of the source electrode and the drain electrode of the transistor 216. The other of the pair of electrodes of the light-emitting element 370 is electrically connected to a wiring 212 serving as a cathode.

The light-emitting element 370 may be an organic electroluminescent element (also referred to as an organic EL element) or the like, for example. Note that the light-emitting element 370 is not limited to an organic EL element; an inorganic EL element formed using an inorganic material may be used.

A high power supply potential VDD is supplied to one of the wirings 211 and 212, and a low power supply potential VSS is supplied to the other. In the configuration illustrated in FIG. 9C, the high power supply potential VDD is supplied to the wiring 211, and the low power supply potential VSS is supplied to the wiring 212.

In the display device including the pixel 301 in FIG. 9C, the pixels 301 are sequentially selected row by row by the scan line driver circuit 204, whereby the transistors 102 are turned on and a data signal is written.

When the transistors 102 are turned off, the pixels 301 to which the data has been written are brought into a holding state. Since the transistor 102 is electrically connected to the capacitor 105, the written data can be held for a long time. Furthermore, the transistor 216 controls the amount of current that flows between the source electrode and the drain electrode of the transistor 102. The light-emitting element 370 emits light with a luminance corresponding to the amount of flowing current. This operation is performed row by row sequentially, whereby an image can be displayed.

The structures, the methods, and the like described in this embodiment can be combined as appropriate with any of the structures, the methods, and the like described in the other embodiments.

Embodiment 4

In this embodiment, examples of electronic devices in each of which the display device of one embodiment of the present invention is included in a display portion will be described with reference to FIGS. 10A to 10H.

FIGS. 10A to 10H illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, an electric field, a current, a voltage, electric power, radiation, a flow rate, humidity, gradient, oscillation, odor, or infrared ray), a microphone 5008, and the like.

Figure 10A:
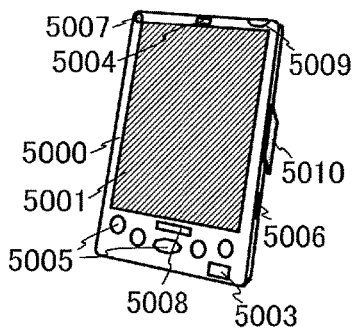
FIGS. 10A to 10H illustrate examples of electronic devices.
Figure 10B:
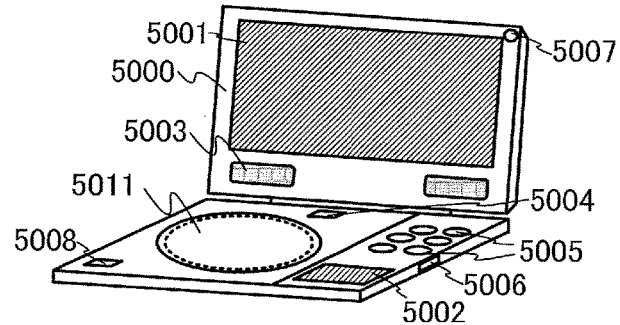
Figure 10C:
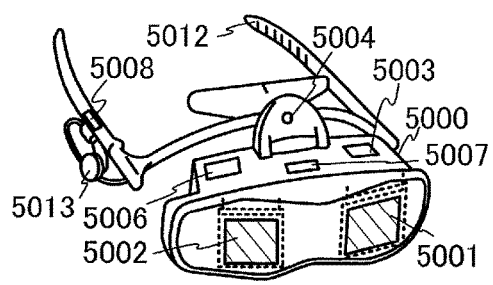
Figure 10D:
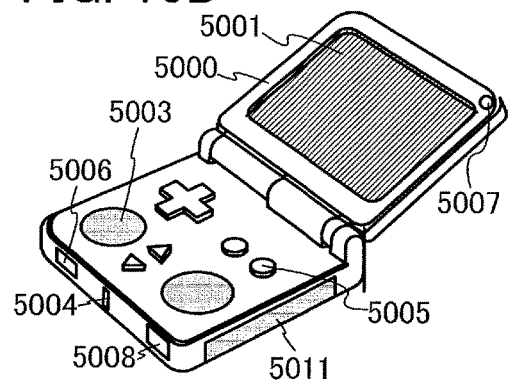
Figure 10E:
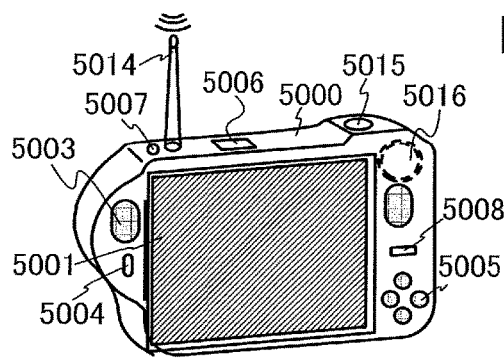
Figure 10F:
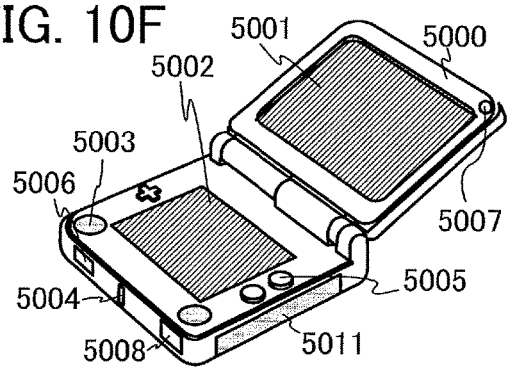
Figure 10G:
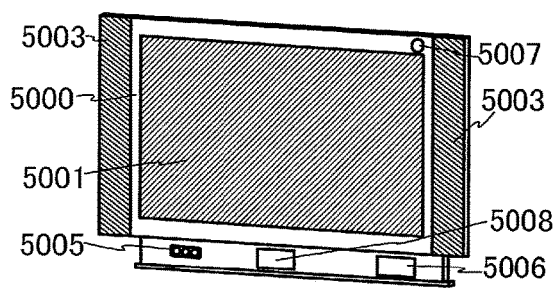
Figure 10H:
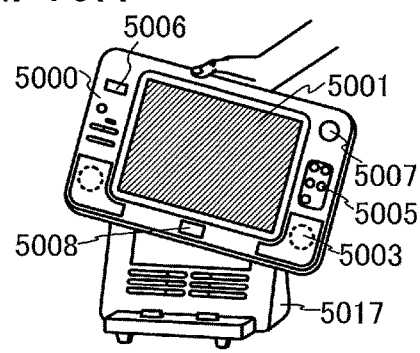

FIG. 10A illustrates a mobile computer which can include a switch 5009, an infrared port 5010, and the like in addition to the above components. FIG. 10B illustrates a portable image reproducing device (e.g., a DVD reproducing device) which is provided with a memory medium and can include a second display portion 5002, a memory medium reading portion 5011, and the like in addition to the above components. FIG. 10C illustrates a goggle-type display which can include the second display portion 5002, a supporting portion 5012, an earphone 5013, and the like in addition to the above components. FIG. 10D illustrates a portable game machine which can include the memory medium reading portion 5011 and the like in addition to the above components. FIG. 10E illustrates a digital camera which has a television reception function and can include an antenna 5014, a shutter button 5015, an image receiving portion 5016, and the like in addition to the above components. FIG. 10F illustrates a portable game machine which can include the second display portion 5002, the memory medium reading portion 5011, and the like in addition to the above components. FIG. 10G illustrates a television receiver which can include a tuner, an image processing portion, and the like in addition to the above components. FIG. 10H illustrates a portable television receiver which can include a charger 5017 capable of transmitting and receiving signals, and the like in addition to the above components.

The electronic devices illustrated in FIGS. 10A to 10H can have a variety of functions. For example, a function of displaying a variety of data (a still image, a moving image, a text image, and the like) on a display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on a display portion, and the like can be given. Further, the electronic device including a plurality of display portions can have a function of displaying image data mainly on one display portion while displaying text data on another display portion, a function of displaying a three-dimensional image by displaying images where parallax is considered on a plurality of display portions, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic devices illustrated in FIGS. 10A to 10H are not limited thereto, and the electronic devices can have a variety of functions.

The electronic devices described in this embodiment each include the semiconductor device of one embodiment of the present invention in a display portion for displaying some sort of data.

The structures, the methods, and the like described in this embodiment can be combined as appropriate with any of the structures, the methods, and the like described in the other embodiments.

This application is based on Japanese Patent Application serial no. 2013-099915 filed with Japan Patent Office on May 10, 2013, the entire contents of which are hereby incorporated by reference.

What is claimed is:

1. A method for forming a display device comprising the steps of:
    forming a conductive layer over a substrate;
    forming a first electrode and a second electrode by patterning the conductive layer;
    forming a first insulating layer covering the first electrode and the second electrode;
    forming an oxide semiconductor layer over the first insulating layer;
    forming a first oxide semiconductor layer overlapping with the first electrode and a second oxide semiconductor layer overlapping with the second electrode by patterning the oxide semiconductor layer;
    forming a source electrode and a drain electrode over and in contact with the first oxide semiconductor layer;
    forming an oxide insulating layer over and in contact with the first oxide semiconductor layer, the source electrode, and the drain electrode;
    forming a first opening in the oxide insulating layer, the first opening overlaps with the second oxide semiconductor layer and the second electrode; and
    forming a pixel electrode from the second oxide semiconductor layer,
    wherein the step of forming the pixel electrode comprises a step of:
        forming a second insulating layer containing hydrogen over and in contact with the second oxide semiconductor layer in the first opening,
    wherein the first oxide semiconductor layer serves as a channel formation region,
    wherein the second electrode, a portion of the first insulating layer, and a portion of the pixel electrode form a capacitor,
    wherein the oxide semiconductor layer contains indium, zinc, and a metal element, and wherein the step of forming the pixel electrode further comprises a step of: removing a part of the second insulating layer overlapped with the first opening after the second insulating layer is in contact with the second oxide semiconductor layer.

2. The method for forming the display device according to claim 1,
    wherein the metal element is any one of Al, Ti, Ga, Y, Zr, La, Ce, Nd, and Hf.

3. The method for forming the display device, according to claim 1,
    wherein the second insulating layer is a silicon nitride layer with a hydrogen concentration of $1 \times 10^{22}$ atoms/cm$^3$ or higher.

4. The method for forming the display device, according to claim 1, further comprising a step of:
    performing first heat treatment on the first oxide semiconductor layer and the second oxide semiconductor layer; and
    performing second heat treatment after forming the oxide insulating layer.

5. The method for forming the display device according to claim 1,
    wherein an amount of oxygen vacancies of the first oxide semiconductor layer is lower than an amount of oxygen vacancies of the pixel electrode.

6. The method for forming the display device according to claim 1,
    wherein a resistivity of the pixel electrode is lower than a resistivity of the first oxide semiconductor layer.

7. A method for forming a display device comprising the steps of:
    forming a conductive layer over a substrate;
    forming a first electrode and a second electrode by patterning the conductive layer;
    forming a first insulating layer covering the first electrode and the second electrode;
    forming an oxide semiconductor layer over the first insulating layer;
    forming a first oxide semiconductor layer overlapping with the first electrode and a second oxide semiconductor layer overlapping with the second electrode by patterning the oxide semiconductor layer;
    forming a source electrode and a drain electrode over and in contact with the first oxide semiconductor layer;
    forming an oxide insulating layer over and in contact with the first oxide semiconductor layer, the source electrode, and the drain electrode;
    forming a first opening in the oxide insulating layer, the first opening overlaps with the second oxide semiconductor layer and the second electrode;
    forming a pixel electrode from the second oxide semiconductor layer;
    wherein the step of forming the pixel electrode comprises a step of:
        forming a second insulating layer containing hydrogen over and in contact with the second oxide semiconductor layer in the first opening, and
    forming a liquid crystal layer over the pixel electrode,
    wherein the first oxide semiconductor layer serves as a channel formation region,
    wherein the second electrode, a portion of the first insulating layer, and a portion of the pixel electrode form a capacitor,
    wherein the oxide semiconductor layer contains indium, zinc, and a metal element, and wherein the step of forming the pixel electrode further comprises a step of: removing a part of the second insulating layer overlapped with the first opening after the second insulating layer is in contact with the second oxide semiconductor layer.

8. The method for forming the display device according to claim 7,
    wherein the metal element is any one of Al, Ti, Ga, Y, Zr, La, Ce, Nd, and Hf.

9. The method for forming the display device, according to claim 7,
    wherein the second insulating layer is a silicon nitride layer with a hydrogen concentration of $1 \times 10^{22}$ atoms/cm$^3$ or higher.

10. The method for forming the display device, according to claim 7, further comprising a step of:

performing first heat treatment on the first oxide semiconductor layer and the second oxide semiconductor layer; and performing second heat treatment after forming the oxide insulating layer.

11. The method for forming the display device according to claim 7, wherein an amount of oxygen vacancies of the first oxide semiconductor layer is lower than an amount of oxygen vacancies of the pixel electrode.

12. The method for forming the display device according to claim 7, wherein a resistivity of the pixel electrode is lower than a resistivity of the first oxide semiconductor layer.

13. The method for forming the display device, according to claim 1, wherein the second insulating layer is a silicon nitride layer, and wherein the oxide insulating layer is covered with the silicon nitride layer.

14. The method for forming the display device, according to claim 7, wherein the second insulating layer is a silicon nitride layer, and wherein the oxide insulating layer is covered with the silicon nitride layer.

* * * * *